US012597759B2

(12) United States Patent (10) Patent No.: US 12,597,759 B2
Eichler et al. (45) Date of Patent: Apr. 7, 2026

(54) COMPONENT WITH STRUCTURED CONNECTION SURFACE, AND METHOD FOR OPERATING A COMPONENT

(71) Applicant: ams-OSRAM International GmbH, Regensburg (DE)

(72) Inventors: Christoph Eichler, Donaustauf (DE); Lars Naehle, Bad Abbach (DE); Sven Gerhard, Alteglofsheim (DE); Alfred Lell, Maxhütte-Haidhof (DE); Harald Koenig, Bernhardswald (DE)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 510 days.

(21) Appl. No.: 18/246,889

(22) PCT Filed: Sep. 21, 2021

(86) PCT No.: PCT/EP2021/075943
§ 371 (c)(1),
(2) Date: Mar. 28, 2023

(87) PCT Pub. No.: WO2022/069296
PCT Pub. Date: Apr. 7, 2022

(65) Prior Publication Data
US 2023/0369831 A1 Nov. 16, 2023

(30) Foreign Application Priority Data
Oct. 1, 2020 (DE) .......................... 102020125719.8

(51) Int. Cl.
H01S 5/40 (2006.01)
H01S 5/00 (2006.01)
(Continued)

(52) U.S. Cl.
CPC .......... H01S 5/4031 (2013.01); H01S 5/0087 (2021.01); H01S 5/04253 (2019.08);
(Continued)

(58) Field of Classification Search
CPC .... H01S 5/0264; H01S 5/0265; H01S 5/0625; H01S 5/06253; H01S 5/4031
See application file for complete search history.

(56) References Cited

U.S. PATENT DOCUMENTS 4,989,214 A * 1/1991 Kwa ..................... H01S 5/0264
372/38.07
5,319,659 A 6/1994 Hohimer
(Continued)

FOREIGN PATENT DOCUMENTS

DE 102010020625 A1 11/2011
EP 0203810 A2 12/1986
(Continued)

OTHER PUBLICATIONS

German Search Report dated May 31, 2021, DE Application No. 102020125719.8, 8 pages.
(Continued)

*Primary Examiner* — Michael Carter
(74) *Attorney, Agent, or Firm* — MH2 Technology Law Group LLP

(57) ABSTRACT

The invention relates to a component with a main part and a contact structure. The main part has an active zone which is designed to generate electromagnetic radiation at least in some regions during the operation of the component. The contact structure has a plurality of individually actuatable segments. The component has a connection surface and a lateral surface running transversely to the connection surface, and the lateral surface is designed as a radiation passage surface of the component. The connection surface is
(Continued)

designed to be structured, wherein the connection surface is defined by common internal boundary surfaces between the main part and the contact structure, and each segment has a local common boundary surface with the main part and is designed for a pixelated current impression into the main part. The invention additionally relates to a method for operating such a component.

19 Claims, 21 Drawing Sheets

(51) Int. Cl.

| | | |
|---|---|---|
| *H01S 5/042* | (2006.01) |
| *H01S 5/20* | (2006.01) |
| *H01S 5/22* | (2006.01) |
| *H01S 5/50* | (2006.01) |
| *H10H 20/00* | (2025.01) |

(52) U.S. Cl.
CPC ...... *H01S 5/04254* (2019.08); *H01S 5/04256* (2019.08); *H01S 5/2036* (2013.01); *H01S 5/22* (2013.01); *H01S 5/50* (2013.01); *H10H 20/042* (2025.01)

(56) References Cited

U.S. PATENT DOCUMENTS

| | | | | |
|---|---|---|---|---|
| 5,835,261 | A | 11/1998 | Tamanuki et al. | |
| 5,848,084 | A * | 12/1998 | Rokugawa | H01S 5/0265 |
| | | | | 372/50.1 |
| 6,408,014 | B1 * | 6/2002 | Ackerman | H01S 5/0265 |
| | | | | 372/50.1 |
| 7,474,682 | B2 * | 1/2009 | Mizuuchi | H01S 5/0625 |
| | | | | 372/87 |
| 10,505,343 | B2 * | 12/2019 | Kobayashi | H01S 5/4012 |
| 2007/0152225 | A1 | 7/2007 | Ooi et al. | |
| 2013/0128909 | A1 * | 5/2013 | Koenig | H01S 5/4031 |
| | | | | 438/33 |
| 2018/0026424 | A1 * | 1/2018 | Kobayashi | H01S 5/50 |
| | | | | 359/245 |

FOREIGN PATENT DOCUMENTS

| | | | |
|---|---|---|---|
| EP | 1710876 | A1 | 10/2006 |
| WO | 2018043229 | A1 | 3/2018 |
| WO | 2020142292 | A1 | 7/2020 |

OTHER PUBLICATIONS

International Search Report dated Jan. 18, 2022, PCT Application No. PCT/EP2021/075943, 7 pages (including English translation).

* cited by examiner

COMPONENT WITH STRUCTURED CONNECTION SURFACE, AND METHOD FOR OPERATING A COMPONENT

CROSS-REFERENCE TO RELATED APPLICATIONS

The present application is the national stage entry of International Patent Application No. PCT/EP2021/075943, filed on Sep. 21, 2021, and published as WO 2022/069296 A1 on Apr. 7, 2022, which claims priority to German Patent Application No. 10 2020 125 719.8, filed on Oct. 1, 2020, the disclosures of all of which are incorporated by reference herein in their entireties.

FIELD OF THE INVENTION

A component, in particular a component with a structured connection surface and a contact structure with individually controllable segments is disclosed. Furthermore, a method for operating a component is disclosed.

BACKGROUND OF THE INVENTION

The design of a component to be produced usually depends on what properties the component shall have in the application. The selected design and the predefined properties of the component are thus fixed and often represent a compromise solution over the entire operating range of the component. In practice, there are often requests that place conflicting requirements on the component, such as low threshold currents and high output power. The conflicting requirements would typically call for different designs, such as narrow strips for low threshold currents and wide strips for high output powers. In terms of high volume production, the component design is often chosen as a compromise solution for multiple requirements.

One object is to specify an efficient and versatile component. Another object is to specify a simplified and effective method for operating a component.

These objects are solved by the component and by the method for operating a component according to the independent claims. Further embodiments and further implementations of the method or of the component are the subject of the further claims.

SUMMARY OF THE INVENTION

According to at least one embodiment of a component, it comprises a main body, a passivation structure and a contact structure. The main body comprises an active zone which is configured to generate electromagnetic radiation at least in places during operation of the component. It is possible that the active zone is configured in places for detecting electromagnetic radiation. The active zone may be formed to be continuous or structured in such a manner that it has a plurality of individual controllable sub-regions. The contact structure has a plurality of segments that are electrically isolated from one another, in particular by the passivation structure, so that the segments of the contact structure are individually electrically activatable or individually controllable. The passivation structure may have a sub-layer that is located, in particular, in the vertical direction and/or in the lateral direction between adjacent segments of the contact structure. The passivation structure may have a plurality of such sub-layers.

A vertical direction is understood to be a direction that is in particular perpendicular to a main extension surface of the main body or of the active zone. A lateral direction is understood to be a direction that is in particular parallel to the main extension surface of the main body or of the active zone. The vertical direction and the lateral direction are for instance orthogonal to each other.

According to at least one embodiment of the component, it has a radiation passage surface which is formed as a radiation entry surface or as a radiation exit surface of the component. The radiation passage surface can be a side surface of the component, in particular of the main body. The side surface of the component is in particular a surface extending along the vertical direction, in particular transverse or perpendicular to the main extension surface of the active zone. The radiation passage surface can be formed by a single side surface or by several side surfaces of the component.

According to at least one embodiment of the component, it has a connection surface which runs transversely, in particular perpendicularly, to the radiation passage surface of the component. The connection surface comprises for instance the surfaces of the segments of the contact structure facing the main body. In addition, the connection surface may be defined by a surface of the passivation structure facing the main body. In particular, the connection surface is defined by a common interface between the main body and the contact structure or between the main body and the passivation structure.

The segment of the contact structure, in particular each segment of the contact structure, has a contact surface facing the main body, which forms a sub-region of the connection surface. In plan view of the connection surface, the contact surfaces of the segments are electrically insulated from each other by the passivation structure. The contact surfaces of the segments can be electrically activated independently from each other. In lateral directions, the contact surfaces are each surrounded, in particular fully surrounded, by the passivation structure. In particular, the connection surface contains the contact surfaces of the segments and the surface of the passivation structure facing the main body, wherein the contact surfaces are spatially separated from one another in lateral directions by the passivation structure. In this sense, the connection surface is structured or pixelated.

If a segment of the contact structure is electrically activated, i.e. in particular electrically connected, a sub-region of the main body adjacent to this segment can be electrically activated. Depending on whether this sub-region is electrically connected in the forward-biased direction or in the reverse-biased direction, the sub-region can emit or detect electromagnetic radiation or be radiation-inactive or radiation-absorbing. The main body, in particular a semiconductor body of the main body, can have a plurality of sub-regions that are spatially spaced apart from one another in lateral directions, at least in places, so that the sub-regions can be electrically contacted individually, i.e. independently from one another.

It is possible that the main body, in particular the semiconductor body or the active zone of the main body, is formed continuously. However, the local contacting of the main body or of the semiconductor body by electrical activation of individual segments can lead to the fact that, in particular due to the relatively low electrical transverse conductivity of the main body or of the semiconductor body, essentially only those sub-regions of the main body are electrically activated which, in plan view, have overlaps with the electrically activated segments. In particular, the injecting of the electrical charge carriers into the main body or into the active zone of the main body occurs essentially only in the areas of overlap with the electrically activated segments of the contact structure.

According to at least one embodiment of the component, the main body comprises a semiconductor body having a first semiconductor layer and a second semiconductor layer, wherein the active zone is arranged in vertical direction between the first semiconductor layer and the second semiconductor layer. In particular, the active zone forms a pn-junction region. In particular, the first semiconductor layer and the second semiconductor layer are each part of an n-side and a p-side of the semiconductor body, respectively, or vice versa. Like the active zone, the first semiconductor layer and/or the second semiconductor layer can be formed to be continuous, or can be formed to be structured and have a plurality of spatially separated sub-regions. It is possible that only one of the semiconductor layers, such as the second semiconductor layer, is structured, and the other semiconductor layer, such as the first semiconductor layer, is formed continuously. The first semiconductor layer and the second semiconductor layer can each be formed as a single layer or as a layer sequence.

In addition to the semiconductor body comprising the semiconductor layers described here and the active zone, the main body can have further layers such as cladding layers, waveguide layers, for example front-side contact layers opposite the contact structure, or a substrate on which the semiconductor body is arranged or epitaxially grown.

In at least one embodiment of a component, the component has a main body and a contact structure. The main body has an active zone which, during operation of the component, is configured at least in places to generate electromagnetic radiation. The contact structure has a plurality of individually controllable segments. The component has a connection surface and a side surface extending transversely to the connection surface, wherein the side surface is formed as a radiation passage surface of the component. The connection surface is structured, wherein the connection surface is defined by internal common interfaces between the main body and the contact structure, and wherein the segments each have a local common interface with the main body and are configured for injecting current into the main body in a pixelated manner.

According to at least one embodiment of the component, the segments are spatially spaced apart from one another in lateral directions by intermediate regions and are thus pixelated in two lateral directions. In particular, the intermediate regions are filled with a gaseous medium, such as air, wherein the segments are electrically insulated from each other due to the intermediate regions. The intermediate regions can be formed by etching away a contact layer or by forming the segments in a structured manner. Alternatively or additionally, it is possible for the component to have a passivation structure that is configured to electrically isolate the segments from one another. The connection surface is formed in a structured manner and can have surfaces of the passivation structure and surfaces of the individually controllable segments. Furthermore, it is possible for the component to have intermediate regions in places and a passivation structure in places for electrically insulating the segments or for achieving a pixelated current injection into the main body.

The passivation structure can be formed from dielectric or electrically insulating materials. It is possible that the passivation structure is formed to be electrically non-conductive by selective deactivation of the electrical conductivity of a layer, for example by implantation, diffusion, etc. It is also possible that the passivation structure is formed from the same material as the segments, but its electrical conductivity is deactivated. For example, the passivation structure has implantation, diffusion, or deactivation regions of the contact structure or the segments. In general, the passivation structure prevents local injection of current into the main body and/or provides electrical isolation between adjacent segments of the contact structure.

The structured connection surface is in particular an inner connection surface which is defined, for example, by an interface between the main body and the passivation structure and/or the contact structure. The surfaces of the individually controllable segments are to be regarded in particular as electrical contact surfaces at which electrical charge carriers are injected from the contact structure into the main body. In this sense, the contact surface of a segment can be understood as a common interface between this segment and the main body. Through the passivation structure or through the intermediate regions, the electrical contact surfaces are electrically isolated from each other in lateral directions. Thus, the connection surface is formed for instance as a plurality of contact surfaces and, in particular, is not a closed single contact surface. In plan view of the connection surface, the contact surfaces of the segments are arranged in a distributed manner in two dimensions. The contact surfaces or the individually controllable segments can thus represent a pixelated current-injection into the base body of the component.

Due to the individually controllable segments, which are electrically separated from each other by the passivation structure or by the intermediate regions, individual sub-regions of the main body can be electrically activated independently from each other, so that the component can be flexibly adapted to different applications. Since the segments can be controlled separately, different operating modes of the component can be set, which can also be changed while the component is in operation. Multiple applications can be covered with a single design of the component which is adapted to different requirements. This results in lower manufacturing complexity and thus lower costs and high yield.

Since the component can be operated in multiple modes, the overall design process can be accelerated, allowing suitable prototypes with flexible design to be delivered as quickly as possible. Due to the flexible design, the component can be adapted to different requirements during operation. This means that customer-specific projects or products with small or medium sales can also be served, which would otherwise hardly lead to special chip technology developments due to the high effort and uncertain success in chip development.

According to at least one embodiment of the component, the main body has a transparent electrically conductive contact layer, which in particular is directly adjacent and is electrically conductively connected to the segments. The transparent electrically conductive contact layer may be of continuous design. Alternatively, it is possible for the transparent electrically conductive contact layer to have a plurality of partial contact layers arranged next to one another, each of which is uniquely assigned to one of the segments. The transparent electrically conductive contact layer is formed, for example, from an electrically conductive oxide.

According to at least one embodiment of the component, the connection surface is defined by internal common interfaces between the main body and the contact structure, wherein the segments each have a local common interface with the main body and are configured for injecting current into the main body in a pixelated manner.

The contact structure with the segments can be arranged on a p-side or on an n-side of the component, in particular of the main body, and can be configured to make electrical contact with the p-side or the n-side. The component can have a further contact structure that is configured for making electrical contact with an n-side or p-side that is not already electrically contacted by the contact structure with the separate segments. However, it is also possible for the component to have a contact structure with the individually controllable segments on both the p-side and the n-side, with the contact structure arranged on the p-side being configured for making electrical contact with the p-side and the contact structure arranged on the n-side being configured for making electrical contact with the n-side.

According to at least one embodiment of the component, it is configured to generate coherent or incoherent electromagnetic radiation in the ultraviolet, visible or infrared spectral range. The component may be an LED, in particular a superluminescent diode (SLED), or a laser. In particular, the component is an edge-emitted emitter, such as an edge-emitted laser. In particular, the component is a pixelated laser chip, such as a laser chip which is pixelated with respect to its connection surface. Alternatively or additionally, it is possible that the component, in particular the main body of the component, has one sub-region or several sub-regions for detecting electromagnetic radiation.

According to at least one embodiment of the component, it has different adjustable operating modes, wherein the different operating modes are adjustable by electrically activating different segments of the contact structure. If a segment is electrically activated, electrical charge carriers can be locally injected from this segment into the main body, for example via the corresponding contact surface. To set an operating mode of the component, several segments or several groups of segments can be electrically activated, which are arranged directly next to each other or separately from one another. To switch to another operating mode of the component, further segments of the contact structure can be electrically activated in addition or as an alternative to the segments already activated, or the segments which have already been activated can be electrically deactivated.

According to at least one embodiment of the component, it comprises simultaneously at least two, three or four of the following operating modes: component as a rigde laser with a rigde width smaller than 50 μm, 40 μm, 30 μm, 20 μm, in particular smaller than 10 μm; component as a rigde laser with a rigde width larger than 10 μm, 20 μm, 30 μm, 40 μm in particular larger than 50 μm; component as a tapered laser; component as a laser array; component as a flared waveguide laser; component as a master oscillator power amplifier structure; and component as a superluminescent diode.

According to at least one embodiment of the component, by activating different electrical connections on the segments of the contact structure at least one of the following properties of the component is/are adjustable during operation, namely: optical output power, threshold current, mode response, and/or far-field characteristics.

According to at least one embodiment of the component, the passivation structure comprises at least one sub-layer, wherein the sub-layer is located both in the vertical direction and in the lateral direction between two adjacent segments of the contact structure.

In lateral directions, a segment is in particular fully enclosed by such a sub-layer, as a result of which the segment is electrically insulated from adjacent segments in lateral directions. In vertical directions, the segment has a contact surface faces the main body and in particular is not covered by the sub-layer of the passivation structure. In plan view of the connection surface, the contact surface of the segment is in particular free from being covered by the passivation structure. The segment has a surface which faces away from the main body and is not covered or is only partially covered by the sub-layer. The regions of the surface of the segment not covered by the sub-layer or by the passivation structure may be exposed. The component may have a plurality of such sub-layers of the passivation structure.

According to at least one embodiment of the component, the contact structure has at least two adjacent L-shaped segments, wherein the adjacent segments are arranged one above the other in places as seen in plan view of the main body and thus have overlaps as seen in plan view. In particular, a sub-layer of the passivation structure is located between the two adjacent L-shaped segments. The one segment arranged in the vertical direction between the main body and a further segment can project laterally beyond the further segment and can be free in regions from being covered by the sub-layer of the passivation structure. In plan view of the contact structure, the adjacent L-shaped segments can thus each have an exposed surface, in particular for receiving an electrical connection.

Due to the L-shaped structure, the segment can have a contact surface facing the main body and a surface facing away from the main body, wherein the surface, which faces away from the main body and is in particular partially or completely exposed, is larger than the contact surface. The surface of the segment facing away from the main body can thus have a sufficiently large area for receiving an electrical connection, such as a bonding wire. In particular, the contact structure has a plurality of such pairs of L-shaped segments arranged one above the other.

According to at least one embodiment of the component, the segments of the contact structure have contact surfaces facing and directly adjoining the main body. In particular, the contact surfaces are defined by the internal common interfaces between the main body and the contact structure, such as between the main body and the segments. With respect to the contact surfaces, the segments are in particular divided into at least two, three or at least four different groups, wherein the contact surfaces of the segments of different groups have different geometric shapes and/or different geometric sizes. The contact surface of one segment is in particular defined by a local common interface between the main body and this segment. The contact surfaces of the segments may have round, square, rectangular, triangular, quadrangular, trapezoidal, striped shapes or other geometric shapes. In case of doubt, a geometric size means the area of the contact surface of the segment. It is possible for a group to have only one segment or several segments of the same type.

According to at least one embodiment of the component, the segments are divided into at least two, three or at least four different groups with respect to their contact surfaces, wherein the contact surfaces of the segments of different groups have the same geometric shape but different geometric sizes. In this case, the contact surfaces of the segments of the same group have in particular the same geometric shape and the same geometric size within the manufacturing tolerances. The contact surfaces of the segments of different groups may be different. For example, the contact surfaces of the segments of a first group are at least two, three, five times or at least ten times as large as the contact surfaces of the segments of a second group different from the first groups.

According to at least one embodiment of the component, the segments of the contact structure have contact surfaces that face and are directly adjacent to the main body, wherein the contact surfaces of the segments are evenly distributed on the main body. In particular, the contact surfaces of the segments have the same geometric shape. For example, the contact surfaces may differ from each other in terms of their geometric sizes by at most 15%, 10%, 8%, 5% or at most 3%.

According to at least one embodiment of the component, one of the segments is formed as the main segment with respect to the contact surfaces, which has the largest contact surface formed as the main contact surface compared to the other segments. The smaller contact surfaces of the secondary segments are formed in particular as switchable secondary contact surfaces. For example, the main contact surface is at least twice, three times, five times, ten times or at least twenty times as large as a secondary contact surface or as the largest secondary contact surface. In particular, the main contact surface is larger than the sum of all secondary contact surfaces. In operation of the component, the main segment may be electrically activated during the entire operating time, while the secondary segments may be temporarily electrically activated and temporarily electrically deactivated, depending on the application.

According to at least one embodiment of the component, the contact surface formed as the main contact surface has a rectangular shape, for example the shape of a rectangular strip. The contact surfaces formed as switchable secondary contact surfaces are formed to be curved at least in places. Such contact surfaces can be strip-shaped and curved in places.

According to at least one embodiment of the component, the main body comprises a first semiconductor layer and a second semiconductor layer, wherein the active zone is arranged between the first semiconductor layer and the second semiconductor layer. In particular, the active zone is formed continuously. The first and/or the second semiconductor layer can be formed to be continuous analogously to the active zone. In particular, the contact structure is configured for electrically contacting the first or the second semiconductor layer.

According to at least one embodiment of a component device, it comprises a plurality of components, in particular the components described above. The components are formed in such a way that they can be switched between at least two different operating modes during operation of the component device. In particular, the contact surfaces of different components formed as switchable secondary contact surfaces have different curvatures. Alternatively or additionally, it is possible that the components are activatable differently during operation of the component device, in particular with respect to the operating modes. The components can also be formed of the same kind.

In accordance with at least one embodiment of the component, the contact structure is configured for electrically contacting the second semiconductor layer, wherein the second semiconductor layer and/or the active zone are/is discontinuous at least in regions. The second semiconductor layer and/or the active zone can thus be pixelated. It is possible that the main body is structured such that it has a plurality of sub-regions which are controllable individually and thus independently from one another. For example, the main body may have separation trenches through which the individually controllable sub-regions of the main body are spatially spaced. The separation trenches may be filled with a material of the passivation structure.

In at least one embodiment of a component device, the component device comprises a component, in particular a component described herein. The component can have a carrier for mechanical stabilization and/or for electrical contacting of the component, a converter for converting electromagnetic radiation and/or an optical element for deflecting or focusing electromagnetic radiation. The optical element can be a prism, a lens or a system of lenses and/or prisms.

In particular, the carrier is an external carrier that is different from a growth substrate. In particular, the carrier has electrical connection points, each of which is electrically conductively connected to one of the segments of the contact structure. The carrier may have transistors configured to drive the segments. For example, the carrier has an IC (integrated circuit) structure for driving the segments.

The converter may have phosphors capable of converting radiation of first peak wavelength into radiation of second peak wavelength, wherein the second peak wavelength is in particular larger than the first peak wavelength. The converter may have different regions with different phosphors.

According to at least one embodiment of the component device, the component is arranged on the carrier and electrically conductively connected to it at a contact layer of the carrier facing the component. The contact layer of the carrier can have a pre-structured geometric shape, as a result of which the contact layer does not cover all segments in plan view. Due to the pre-structured geometric shape, the contact layer of the carrier can only be electrically conductively connected to predefined segments. The pre-structured geometric shape of the contact layer of the carrier thus defines a predefined operating mode of the component.

According to at least one embodiment of the component device, it comprises several components arranged next to one another, the components each having different adjustable operating modes. The different operating modes of the individual component are adjustable in particular by electrically activating different segments of the contact structure of the associated component.

In at least one embodiment of a method for operating a component having different adjustable modes of operation, the different modes of operation are set by electrically activating different segments of the contact structure.

The component is in particular a component described herein, which has a main body and a contact structure. The main body has an active zone which, during operation of the component, is configured to generate electromagnetic radiation at least in places. The contact structure has a plurality of individually controllable segments. The component has a connection surface and a side surface extending transversely to the connection surface, wherein the side surface is formed as a radiation passage surface of the component. The connection surface is implemented in a structured manner, wherein the connection surface is defined by internal common interfaces between the main body and the contact structure. The segments each have a local common interface with the main body and are arranged for pixelated current injecting into the main body.

For example, one of the plurality of operating modes of the component is initially selected, wherein activation of the selected operating mode is accomplished by electrically activating a group or a plurality of groups of the segments, and wherein the group or plurality of groups of activated segments is configured to define the selected operating mode of the component. It is possible for the component to operate in a plurality of different operating modes during an operating period.

According to at least one embodiment of a method, a first group of the segments is electrically activated, as a result of which charge carriers are injected into the main body in the forward-biased direction to generate electromagnetic radiation, while a second group of the segments is not electrically activated or is electrically activated in such a way that the sub-regions of the main body located below the segments of the second or further group are not configured to generate electromagnetic radiation.

According to at least one embodiment of a method, a first group of the segments is electrically activated, as a result of which charge carriers are injected into the main body in the forward-biased direction to generate electromagnetic radiation, wherein a third group of the segments is electrically activated, as a result of which charge carriers are injected into the main body region-wise in the reverse-biased direction to form absorbing regions.

According to at least one embodiment of a method, a first group of the segments is electrically activated, as a result of which charge carriers are injected in the forward-biased direction into the main body for generating electromagnetic radiation, wherein a fourth group of the segments is electrically activated, as a result of which at least a sub-region of the main body is configured as a detector segment for measuring a photocurrent.

According to at least one embodiment of a method, a first group of the segments is electrically activated, as a result of which charge carriers are injected in the forward-biased direction into the main body for generating electromagnetic radiation. In addition, a third group of the segments is electrically activated, as a result of which charge carriers are injected into the main body in the reverse-biased direction in regions to form absorbing regions. Furthermore, a fourth group of the segments is electrically activated, as a result of which at least a sub-region of the main body is configured as a detector segment for measuring a photocurrent.

The first, second, third and fourth groups of segments can be electrically activated or deactivated independently from each other. It is therefore possible for any number of these groups to be electrically activated during operation of the component, depending on the application of the component. In particular, it is possible that all segments are temporarily assigned to the first, second, third or fourth groups. The component may have a plurality of such first, second, third and/or fourth groups of segments.

According to at least one embodiment of a method, different groups of segments are electrically activated for far-field control, wavelength stabilization, adjustment of facet current, adjustment of color spectrum or exit location of generated electromagnetic radiation, and/or adjustment of resonator length, optical output power, operating current, threshold current, mode response, or far-field characteristics of the device. It is possible that different groups of segments are electrically activated at different operating times.

BRIEF DESCRIPTION OF THE DRAWINGS

Further embodiments and further implementations of the component or of the method for operating the component will be apparent from the exemplary embodiments explained below in connection with FIGS. 1A to 14E.

DETAILED DESCRIPTION

Figure 1A:
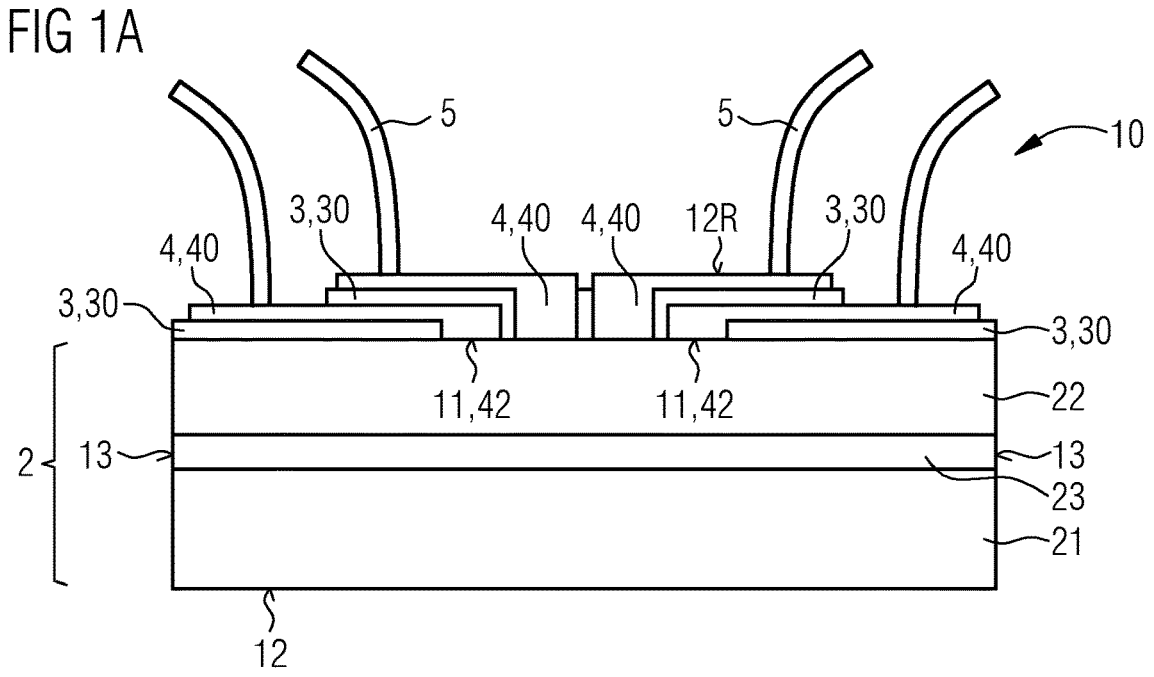
FIGS. 1A, 1B and 1C show schematic representations of an exemplary embodiment of a component in various sectional views.

Identical, equivalent or equivalently acting elements are indicated with the same reference numerals in the figures. The figures are schematic representations and thus not necessarily true to scale. Comparatively small elements and particularly layer thicknesses can rather be illustrated exaggeratedly large for the purpose of better clarification.

FIG. 1A shows a schematic sectional view of a component 10 having a main body 2 and a contact structure 4 disposed on the main body 2 and having a plurality of segments 40. The component 10 also has a passivation structure 3 arranged on the main body 2 for mutual insulation of the segments 40. The passivation structure 3 has a plurality of sub-layers 30, each of which is configured to electrically insulate adjacent segments 40 from each other or to electrically insulate a sub-region of a segment 40 from the main body 2. If a sub-layer 30 is exclusively configured for electrically insulating adjacent segments 40, this sub-layer 30 may be arranged in places both in the lateral direction and in the vertical direction between the adjacent segments 40. The sub-layer 30 can be L-shaped.

The main body 2 has a first semiconductor layer 21, a second semiconductor layer 22 and an active zone 23 disposed between the semiconductor layers 21 and 22. For example, the first semiconductor layer 21 is of n-type and the second semiconductor layer 22 is of p-type, or vice versa. For example, the main body 2 is a semiconductor body or has a semiconductor body.

In operation of the component 10, the active zone 23 is configured to generate or detect electromagnetic radiation, for example, in the ultraviolet, infrared, or visible spectral ranges. For example, the active zone 23 is a pn-junction zone. The main body 2 or the semiconductor body of the main body 2 may be based on a III-V or on a II-VI semiconductor compound material. In particular, a body is based on a III-V compound semiconductor material if it comprises at least one element from the main group III, such as Al, Ga, In, and one element from the main group V, such as N, P, As. In particular, the term "III-V semiconductor compound material" includes the group of binary, tertiary and quaternary compounds containing at least one element from main group III and at least one element from main group V, for example nitride and phosphide compound semiconductors. Analogously, it also applies to a main body 2 based on the group II-VI compound semiconductor material.

The component 10 has a bottom surface 12V which is formed in particular by an exposed surface of the main body 2. It is possible that the component 10 has at least one contact layer on the bottom surface 12V, which is configured for electrically contacting the first semiconductor layer 21. The contact structure 4 having the segments 40 is configured for electrical contacting, in particular for pixelated contacting of the second semiconductor layer 22. The segments 40 can be individually electrically controlled or activated, for example, via separate electrical connections 5, which are present, for example, in the form of bonding wires or solder connections. By selectively electrically activating the segments 40, local regions of the main body 2 can be excited, in particular independently from one another, to emit or to detect electromagnetic radiation. The first semiconductor layer 21, the second semiconductor layer 22 and/or the active zone 23 can be formed to be continuous, or to have separate sub-regions and thus are form to be structured or pixelated.

The component 10 has a top surface 12R formed in regions by surfaces of the passivation structure 3 and of the contact structure 4. In plan view of the top surface 12R, the component 10 has surfaces of the segments 40 arranged next to one another and spaced apart from one another in lateral directions by the passivation structure 3. The surfaces of the segments 40 are configured to receive the electrical connections 5. The component 10 has at least one side surface 13 which, along the vertical direction, connects the bottom surface 12V to the top surface 12R. In particular, the side surface 13 is configured as a radiation passage surface, such as a radiation entrance surface or a radiation exit surface, of the component 10. It is possible that only one side surface 13, or all side surfaces 13, is/are formed as radiation passage surface/s of the component 10. In particular, the component 10 is an edge emitter.

The component 10 has a connection surface 11. In particular, the connection surface 11 is an inner connection surface 11 of the component 10 arranged in the vertical direction between the bottom surface 12V and the top surface 12R. For example, the connection surface 11 is defined by a common interface between the main body 2 and the contact structure 4. At the connection surface 11, the segments 40 are in particular directly adjacent to the main body 2, in particular to the second semiconductor layer 22 of the main body 2. At the connection surface 11, the segments 40 each have a contact surface 42. The contact surface 42 of a segment 40 is formed in particular by a common interface between the main body 2 and the segment 40 associated with the contact surface 42. In lateral directions, the contact surfaces 42 are spatially and electrically separated from each other by the passivation structure 3.

At the contact surfaces 42, electrical charge carriers are locally injected into the main body 2 during electrical activation of the corresponding segments 40. By selective electrical activation of predetermined segments 40, the main body 2 can be excited to emit or to detect electromagnetic radiation in its predetermined sub-regions. Depending on the applications, the contact surfaces 42 may each have a maximum lateral extent between 1 μm and 5000 μm inclusive, 2 μm and 1000 μm and 5 μm and 200 μm and 5 μm and 50 μm or between 1 μm and 10 μm inclusive. However, the contact surfaces 42 are generally not limited thereto.

To facilitate the accommodation of the electrical connections on the top surface 12R, the segments 40 may be formed such that the segments 40 each have a smaller contact surface 42 on the connection surface 11 compared to their exposed surface on the top surface 12R. The electrical connections 5 may be bonding wires, solder balls, or contacts of an IC chip or carrier. Thus, the segments 40 are driven by an IC chip, for example, via bonding wires, solder balls, or direct connection. For example, the exposed surface area of the segment 40 on the top surface 12R is at least 30%, 50%, 100%, 200% or 300% larger compared to the corresponding contact surface 42 on the connection surface 11. In particular at least in sectional view along the vertical direction, such a segment 40 is L-shaped. The L-shaped segments 40 are shown schematically in FIG. 1A, for example.

Figure 1B:
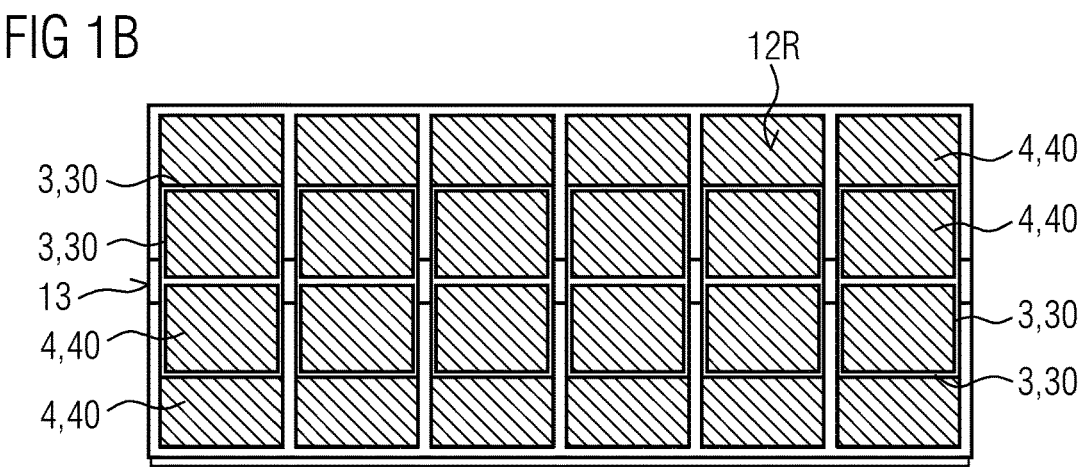

FIG. 1B shows the component 10, described for instance in connection with FIG. 1A, in plan view of its top surface 12R. The component 10 has a plurality of segments 40 arranged in groups of four side by side. For example, one such group of four segments 40 is schematically shown in FIG. 1A. The group of four has two pairs of the segments 40, wherein the segments 40 of the same pair are arranged regionally offset along the lateral direction and regionally stacked along the vertical direction. For electrically insulating the segments of the same pair, a sub-layer 30 of the passivation structure 3 is located both along the vertical direction and along the lateral direction between the segments 40, in particular between the L-shaped segments 40 of the same pair.

Figure 1C:
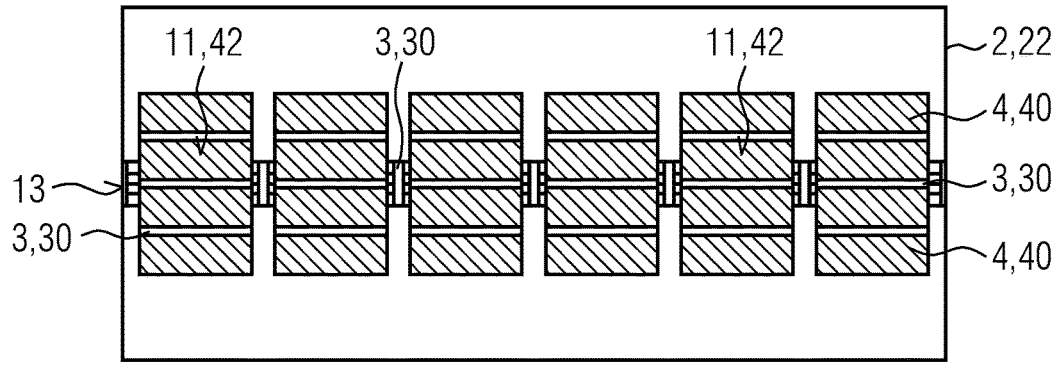

FIG. 1C shows the component 10 described for instance in connection with FIGS. 1A and 1B in a top view of the connection surface 11. The contact surfaces 42 cover the main body 2 in top view only partially, for example at most 80%, 70%, 60%, 50%, 40%, 30% or at most 20% of a surface of the main body 2 or of the second semiconductor layer 22 of the main body 2. In particular, the contact surfaces 42 are arranged overall centrally and symmetrically on the main body 2. For example, the contact surfaces 42 are arranged such that the connection surface 11 has a mirror symmetry, in particular at least a twofold or fourfold axis symmetry.

According to FIGS. 1B and 1C, the contact structure 4 has 24 segments 40. Deviating from this, it is possible that the contact structure 4 has a larger or smaller number of segments 40. In FIGS. 1B and 1C, the passivation structure 3 is shown only schematically. Deviating from these figures, it is possible that the passivation structure 3 is formed in such a way that it completely fills all intermediate regions between the segments 40. For example, it is possible that in plan view the passivation structure 3 and the contact structure 4 together completely cover the main body 2, in particular the first semiconductor layer 21, the second semiconductor layer 22 and/or the active zone 23.

Figure 2A:
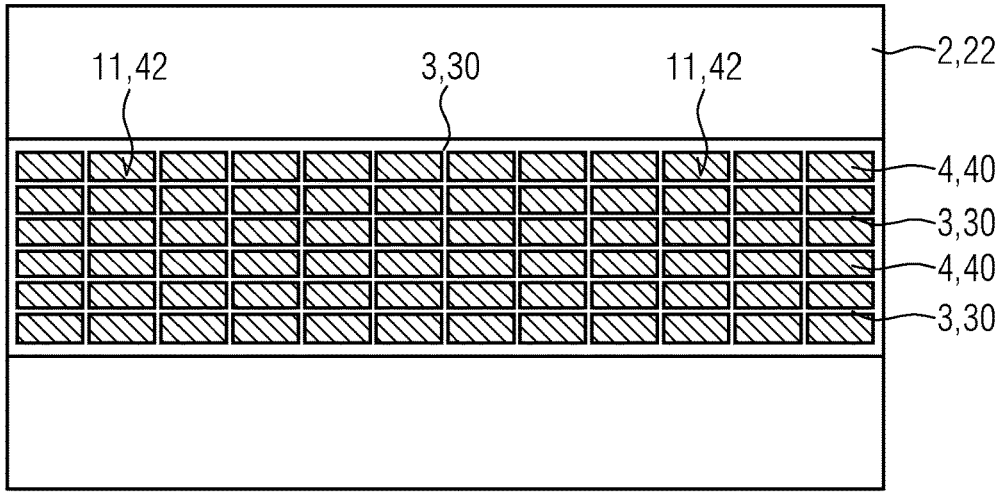
FIGS. 2A, 2B, 2C, 2D, 2E, 2F, and 2G show schematic representations of further exemplary embodiments of a component in plan view of the connection surface.

The exemplary embodiment of a component 10 shown in FIG. 2A essentially corresponds to that of the component 10 shown in FIG. 1C. In contrast, the passivation structure 3 is shown in greater detail. In addition, the contact structure 4 has 72 contact surfaces instead of 24. Analogous to FIG. 1C, the contact surfaces 42 shown in FIG. 2A are of the same design in terms of their geometric shape and size. The individually controllable segments 40 or the contact surfaces 42 are arranged in columns and rows and thus matrix-like on a two-dimensional surface.

By selective activation and regulation of the individual segments 40, it is possible to control which function the component 10 is to have, in particular with regard to its power and optical properties. In this sense, the component 10 is a multifunctional emitter whose properties can be adjusted by selective electrical activation of the individually controllable segments 40. The component 10 can be operated, for example, as a laterally monomode laser with a small ridge width, for example around 2 μm, as a power laser with a large ridge width, for example around 50 μm, and all gradations in between, as a tapered laser for high powers, in particular also with a fundamental-mode far field, or as a SLED.

Figure 2B:
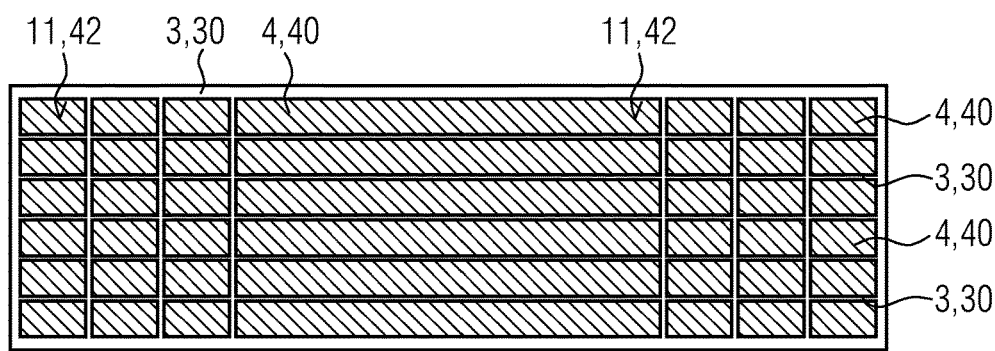

The examplary embodiment of a component 10 shown in FIG. 2B corresponds essentially to that of the component 10 shown in FIG. 2A. In contrast thereto, the contact structure 4 has two different groups of segments 40, wherein the contact surfaces 42 of the segments 40 of different groups differ from one another in terms of their geometric sizes. The segments 40 of the first group with larger contact surfaces 42 are arranged centrally and adjoin the segments 40 of the second group with smaller contact surfaces 42 on the left and right.

Figure 2C:
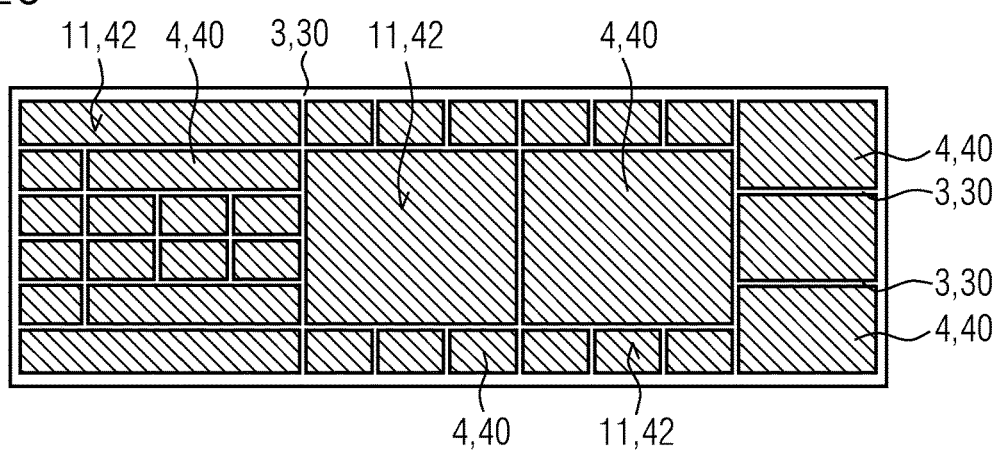

The examplary embodiment of a component 10 shown in FIG. 2C corresponds essentially that of to the component 10 shown in FIG. 2A. In contrast thereto, the contact structure 4 has a plurality, in this case five, of different groups of segments 40, wherein the contact surfaces 42 of the segments 40 of different groups differ from one another with respect to their geometric sizes. The contact surfaces 42 of the segments 40 of different groups are arranged in a distributed manner on the connection surface 11.

Figure 2D:
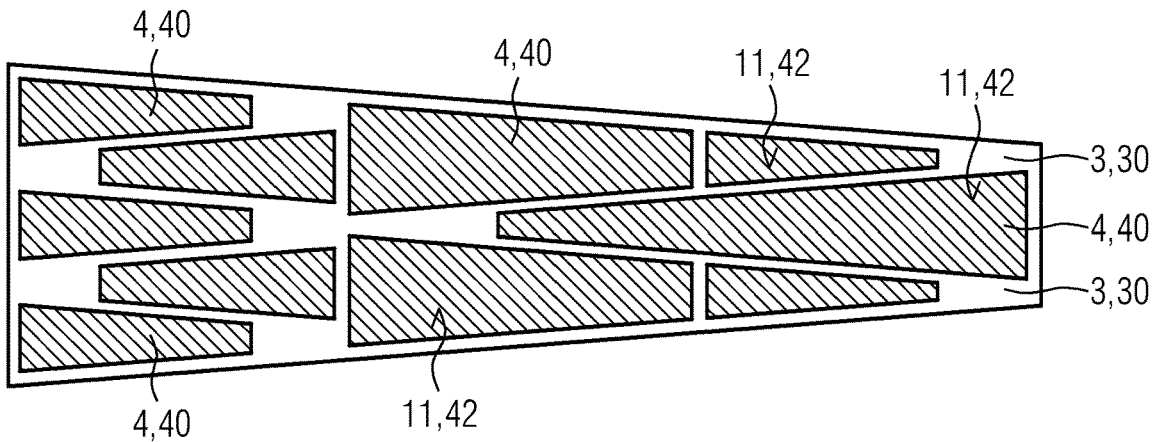

The examplary embodiment of a component 10 shown in FIG. 2D corresponds essentially to that of the component 10 shown in FIG. 2B or 2C. In contrast thereto, the contact surfaces 42, in particular all contact surfaces 42, are not rectangular but trapezoidal in shape. Compared to FIGS. 2B and 2C, the connection surface 11 is formed in a trapezoidal shape rather than rectangular overall.

Figure 2E:
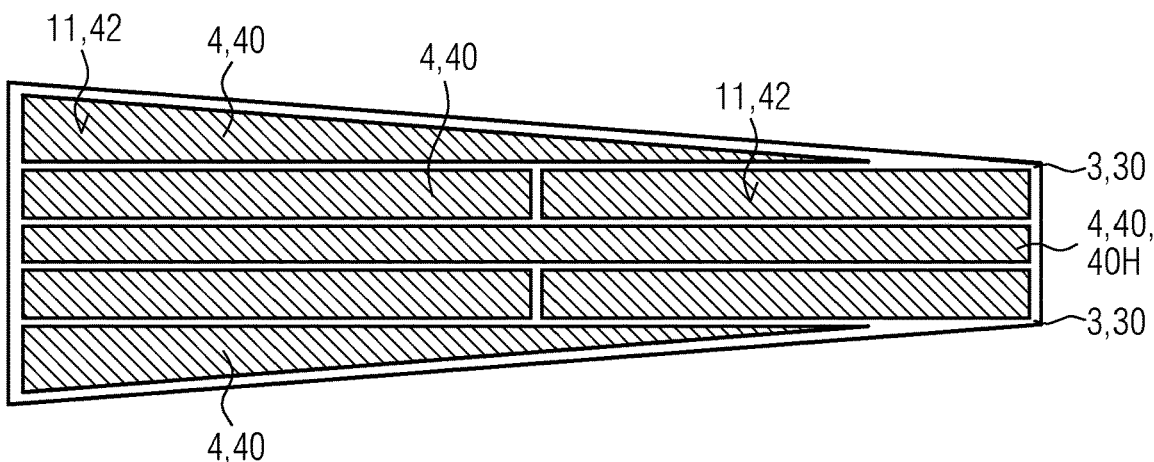

The embodiment of a component 10 shown in FIG. 2E is essentially the same as the component 10 shown in FIG. 2D, except that the contact surfaces 42 of the segments 40 of different groups are rectangular, strip-shaped or triangular.

Figure 2F:
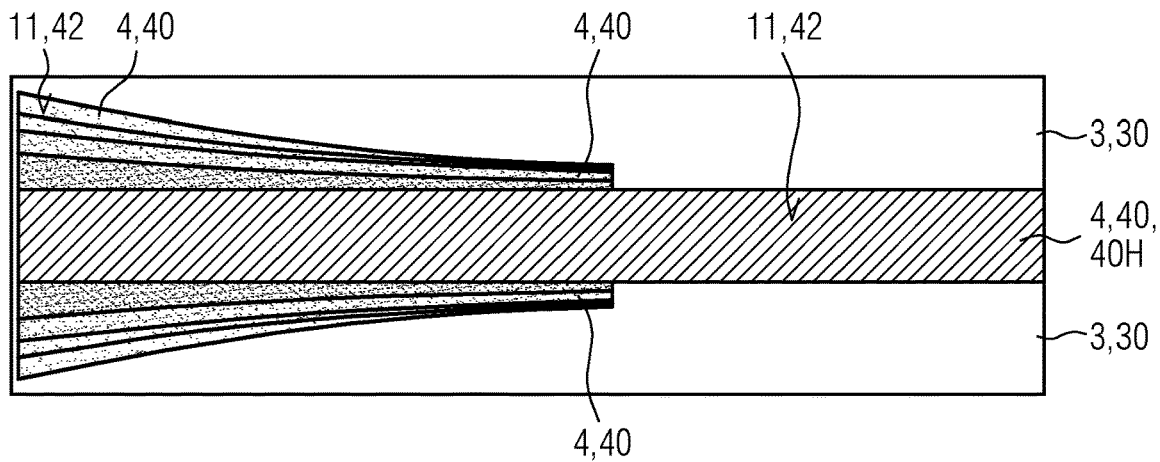

The embodiment of a component 10 shown in FIG. 2F corresponds essentially to that of the component 10 shown in FIG. 2E. In contrast, the contact structure 4 has a main segment 40H with the largest contact surface 42 and a plurality of connectable secondary segments 40 with smaller contact surfaces 42. The contact surface 42 of the main segment 40H is rectangular and centrally arranged on the connection surface 11. The contact surfaces 42 of the secondary segments 40 are curved and strip-shaped and are arranged in particular symmetrically to the contact surface 42 of the main segment 40H. For the sake of clarity, the sub-layers of the passivation structure 3 between the segments 40 are not shown in FIG. 2F. According to FIGS. 2C, 2D, 2E and 2F, the connection surface 11 has a mirror symmetry, in particular a simple mirror symmetry.

During operation of the component 10, the main segment 40H may in particular be electrically activated at all time. To adjust the light properties or the light guidance, the secondary segments 40 can be switched on if required. The component 10 shown in FIG. 2F is in particular a trapezoidal laser with switchable width, in particular a narrow lateral monomode laser with trapezoidal laser option through nonangular contact surfaces 42, namely through non-angular secondary segments 40. This component 10 can also be a power laser, wherein, for example, trapezoidal secondary segments can be switched on for higher powers or for achieving reduced facet load. According to FIG. 2F, there is the option to add a perfect trapezoid in the direction of the facet to the laterally monomode laser. This is realized by the non-rectangular side segments 40. Depending on which of the secondary segments 40 are electrically activated, the shape of the trapezoid and thus the light guidance can be adapted.

Figure 2G:
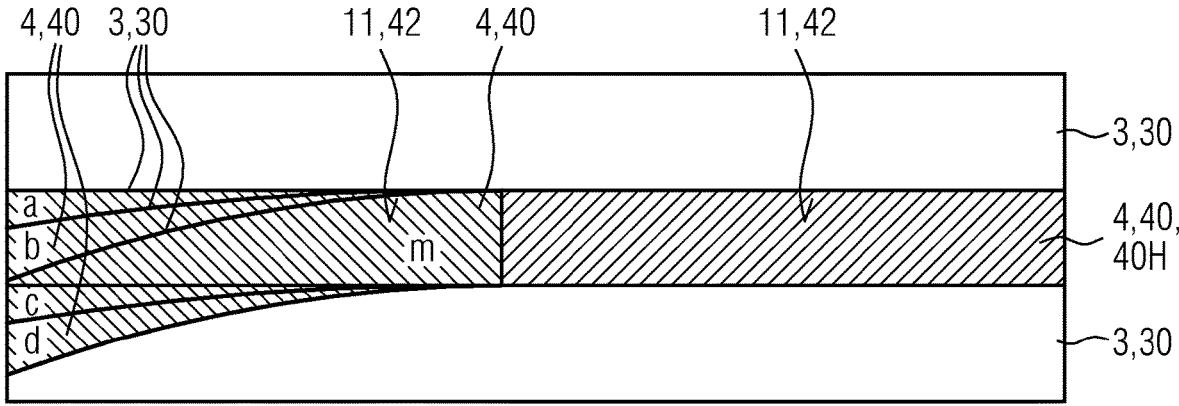

The examplary embodiment of a component 10 shown in FIG. 2G corresponds essentially to that of the component 10 shown in FIG. 2F. In contrast to FIG. 2F, the contact surface 42 of the main segment 40H shown in FIG. 2G is for instance only half as large. The secondary segments 40 are not arranged symmetrically with respect to their contact surfaces 42 to the contact surface 42 of the main segment 40H. The sum of the contact surfaces 42 of the segments 40H, 40a, 40b and 40m shown in FIG. 2G corresponds essentially exactly to the contact surface 42 of the main segment 40H shown in FIG. 2F.

A device 10 shown in FIG. 2G can be switchably operated between a superluminescent diode, SLED, and a laterally monomode laser. For example, such a device is switchable between a laterally monomode ridge laser and a SLED with different angles of curvature. At low curvatures, i.e. at high radii of curvature, laser operation can certainly still be achieved with such a component 10. An advantage of such a structure is that interference phenomena can be minimized by broadening the wavelength distribution. Such components 10 can be used in projection applications, for example for augmented reality/virtual reality.

The main segment 40H shown in FIG. 2G as well as the further centrally arranged segment 40m can be switched on at all time. For lateral monomode laser operation, the secondary segments 40a and 40b are additionally on. For SLED operation, the secondary segments 40b, 40c and/or 40d as well as further secondary segments with different radii of curvature, which are not shown in FIG. 2G, can additionally be switched on.

According to at least one embodiment of a component device, it has several components, such as at least three, four, six or at least ten components. The components 10 may be arranged side by side, for example on a common carrier. The components may be switchably operated between a superluminescent diode, SLED, and a laser, such as a lateral monomode laser. Such a component device could be particularly advantageous for augmented reality applications, as detuning of the wavelength of the radiation emitted by individual devices can be achieved via the slightly different curvature of the laser bars. This may be of critical importance in avoiding interference effects. The component device 100 described herein may include a plurality of components that are operable in operation of the component device 100 as multiple emitters, for example, as 4-fold emitters. In particular, due to the geometry and activation of the secondary segments 40, the individual emitters may have slightly different radii of curvature.

Figure 3A:
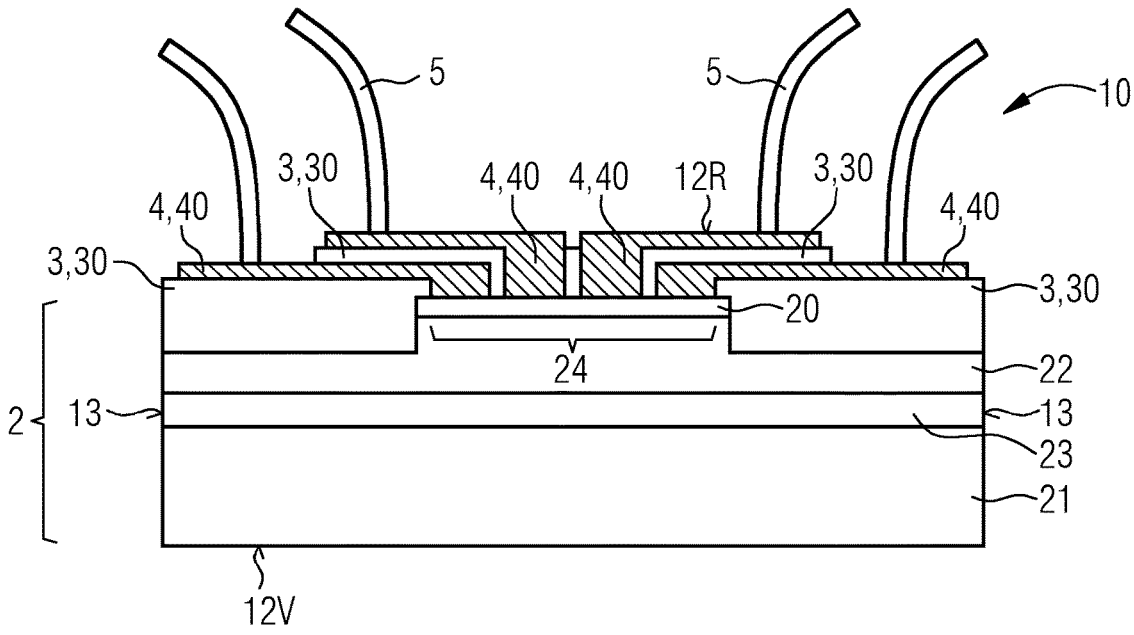
FIGS. 3A and 3B show schematic representations of further exemplary embodiments of a component, each in sectional view.

The examplary embodiment of a component 10 shown in FIG. 3A corresponds essentially to that of the component 10 shown in FIG. 1A. In contrast to FIG. 1A, wherein the main body 2, in particular the second semiconductor layer 22, has a flat surface facing the contact structure 4, the main body 2, in particular the second semiconductor layer 22, of the component 10 shown in FIG. 3A has a step-like, in particular continuous contact region 24. The contact region 24 is enclosed, in particular fully enclosed, in the lateral direction by the passivation structure 3. This vertically elevated contact region 24 forms a so-called ridge region of the component 10. In plan view, in particular all contact surfaces 42 are located on the contact region 24. The component 10 shown in FIG. 1A may be formed as a broad-strip laser. The component shown in FIG. 3A is formed in particular as a ridge laser.

As a further difference to FIG. 1A, FIG. 3A schematically shows a contact layer 20 of the main body 2. In particular, the segments 40 are directly adjacent to the contact layer 20. The contact layer 20 is formed in particular from a radiation-transmissive, electrically conductive oxide (TCO), such as indium tin oxide (ITO). The contact layer 20 can be of continuous design. Due to the comparatively low transverse conductivity, the contact layer 20 can also be electrically activated only locally, as a result of which a pixelated injection of current in the main body 2 is still possible. Alternatively, the contact layer 20 can be formed in a structured manner and have a plurality of laterally spaced sub-layers. In the presence of the contact layer 20, the boundaries between two segments 40 may soften somewhat, so that preferably no gaps are formed between the segments 40.

Figure 3B:
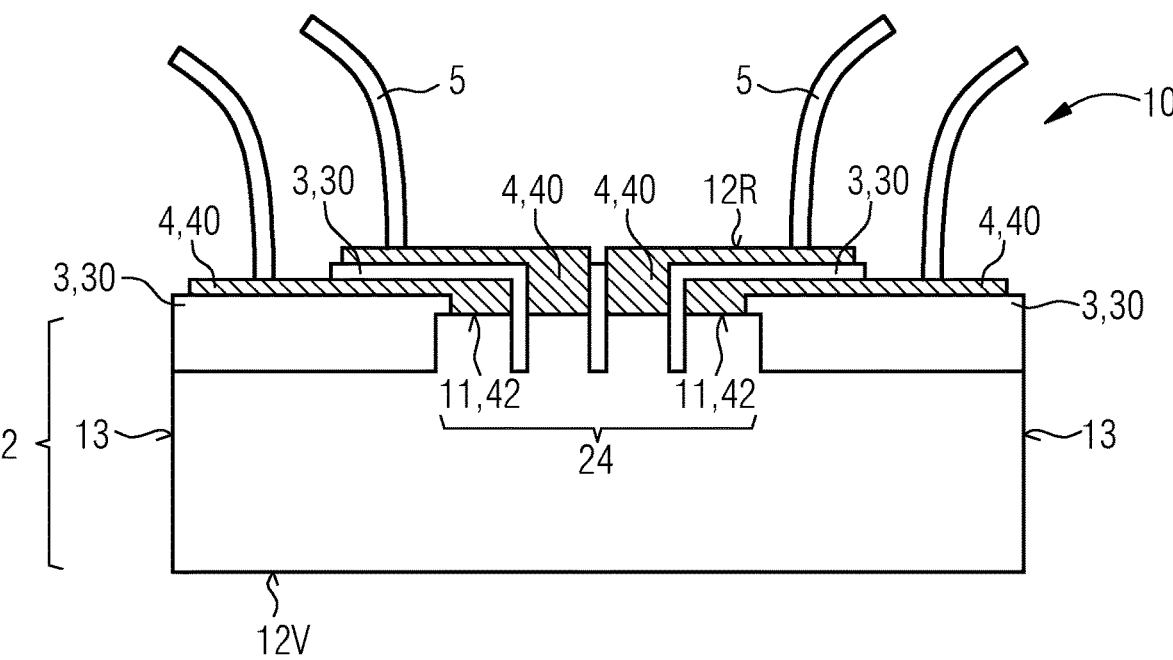

The examplary embodiment of a component 10 shown in FIG. 3B corresponds essentially to that of the component 10 shown in FIG. 3A. In contrast thereto, the contact region 24 has a plurality of sub-regions arranged next to one another, which are spatially separated from one another in particular by separation trenches. The separation trenches can be filled, in particular completely filled with electrically insulating material, for example with a material of the passivation structure 3. Each sub-region of the contact region 24 may form a so-called ridge region of the component 10. Along the vertical direction, the separation trenches extend in particular only into the second semiconductor layer 22. However, it is possible that the separation trenches extend through the second semiconductor layer 22 and/or through the active zone 23 into the first semiconductor layer 21.

Figure 4A:
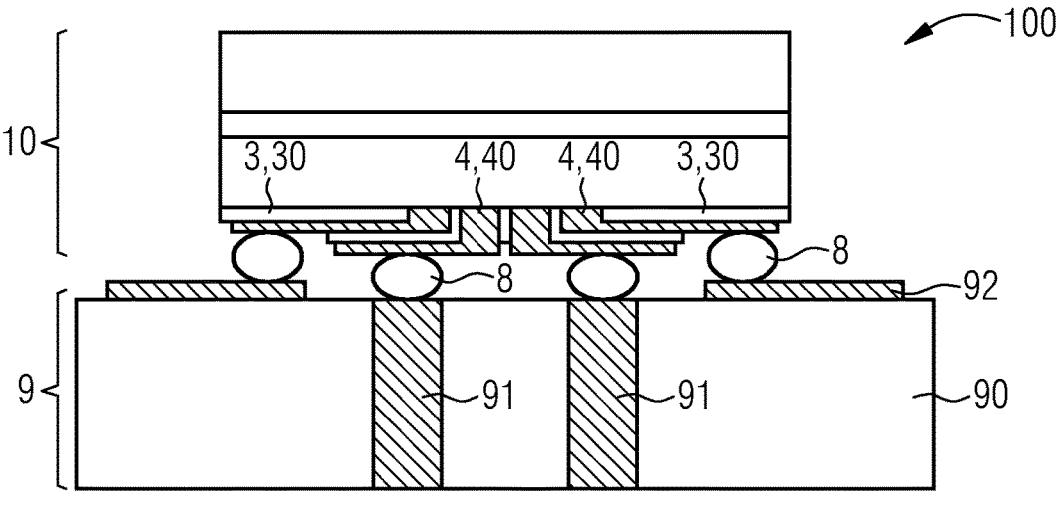
FIGS. 4A, 4B, 4C, 4D, 4E, 5A, 5B, and 5C show some exemplary embodiments of a component device having a component described herein.

In FIG. 4A, a component device 100 comprising a component and a carrier 9 is shown schematically. The carrier 9 is in particular an external carrier, such as a carrier plate, with a mounting surface having electrical connection points. The electrical connection points are in particular surfaces of connection pads arranged on a base body 90 of the carrier 9, or surfaces of through-contacts 91 extending along the vertical direction from a top surface of the base body 90 to a bottom surface of the base body 90. In particular, the component 10 is a component described herein, shown schematically in FIG. 1A, for example. The segments 40 can each be electrically conductively connected to one of the connection points of the carrier 9 via electrical connections, which are here in the form of solder balls.

Figure 4B:
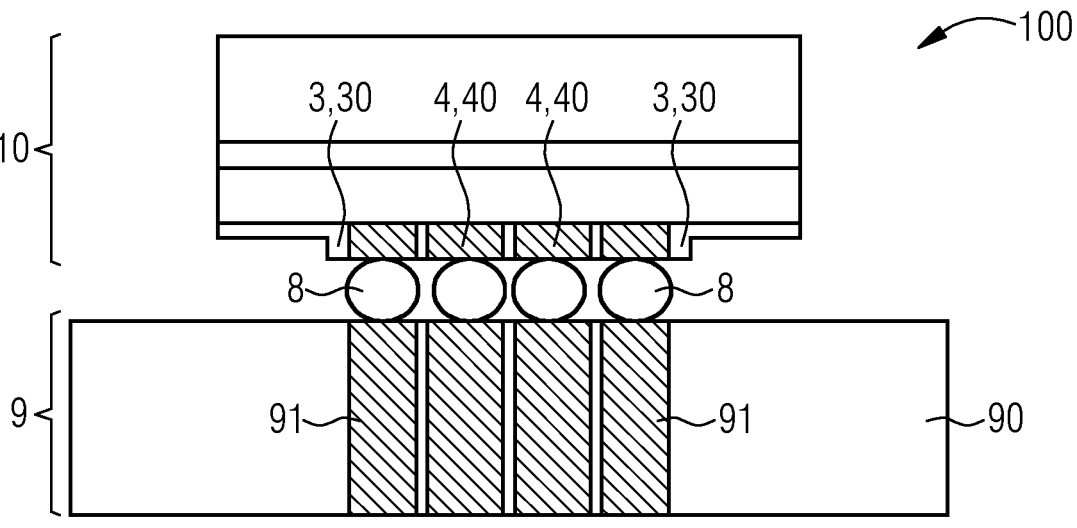

The exemplary embodiment of a component device 100 shown in FIG. 4B corresponds essentially to that of the component device 100 shown in FIG. 4A. In contrast thereto, the carrier 9 has only through-contacts 91. The segments 40 of the contact structure 4 may each be columnar. Along the vertical direction, these segments 40 may have a constant cross-section or a constant diameter. Deviating from FIG. 4B, it is possible that the passivation structure 3 with the sub-layers 30 is not present. Instead of the passivation structure 3, there may be intermediate regions which are configured to electrically insulate adjacent segments. These intermediate regions may be filled with a gaseous medium.

Alternatively, it is possible for the component 10 to have the passivation structure 3 in places and the above-mentioned intermediate regions in places.

Figure 4C:
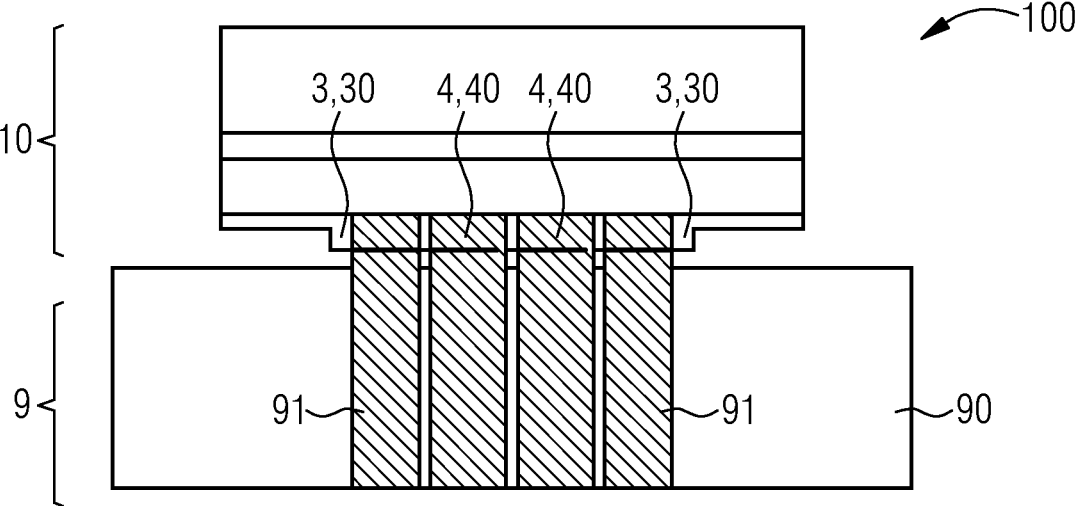

The examplary embodiment of a component device 100 shown in FIG. 4C corresponds essentially to that of the component device 100 shown in FIG. 4B. In contrast thereto, the segments 40 can be electrically conductively connected directly to the through-contacts 91 of the carrier 9. Instead of a soldering process, a direct bonding process may be used to establish a mechanical and electrical connection between the carrier 9 and the component 10.

Figure 4D:
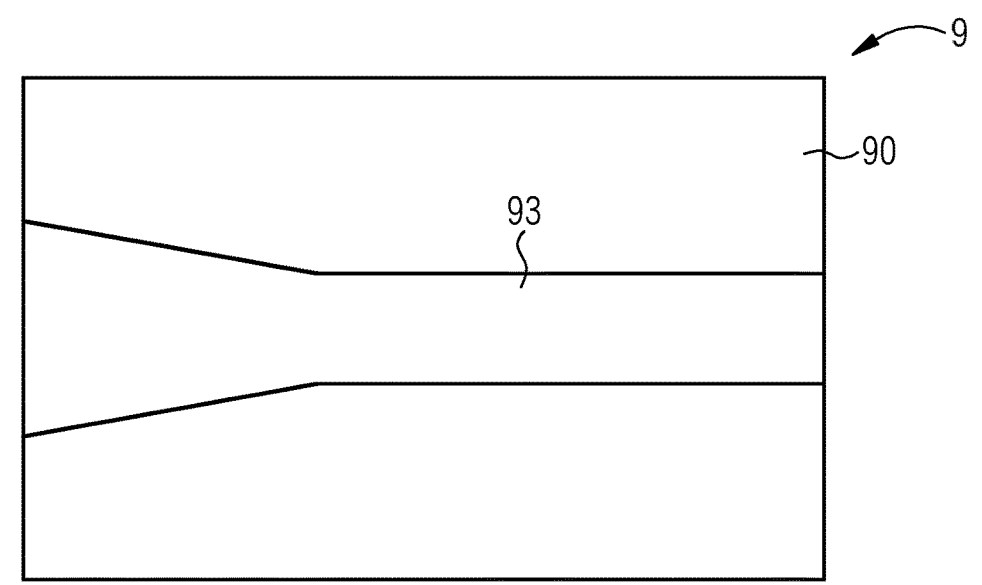

It is also possible for the carrier 90 to have a mounting surface with a plurality of connection points, wherein the connection points are arranged on the mounting surface in accordance with the segments 40 of the component 10. The establishment of an electrical and mechanical connection between the carrier 90 and the component 10 can thus be carried out in a simplified manner. A carrier 90 having a contact layer 93 or a contact surface 93 on the mounting surface is schematically shown in FIG. 4D. The contact layer 93 may be formed as one continuous layer or as a collection of multiple connection points. The contact layer 93 or the contact surface 93 has a predefined geometry. For example, the component 10 is connected, for instance soldered, joined, clamped or fused (German: verschmolzen), to the top surface 12R on the mounting surface of the carrier 9.

Figure 4E:
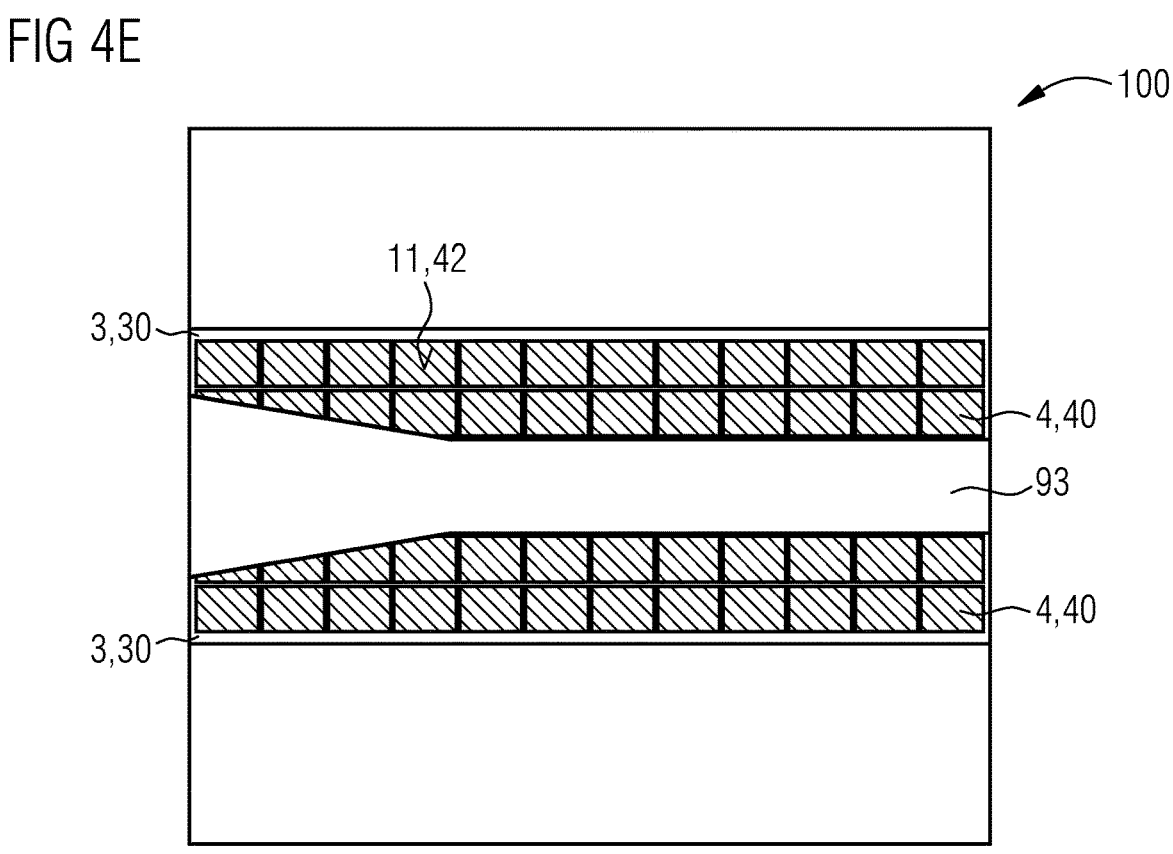

The predefined geometry of the contact layer 93 or contact surface 93 determines which of the segments 40 are electrically conductively connected or not electrically conductively connected to the contact layer 93 of the carrier 90. This is shown schematically, for example, in FIG. 4E, in particular for a trapezoidal laser operation of the component 10 or the component device 100. In all examplary embodiments it is possible that the carrier 9 contains electronic circuits and/or transistors for controlling the individual segments 40. In particular, the carrier 90 is a control element for driving the segments 40.

Figure 5A:
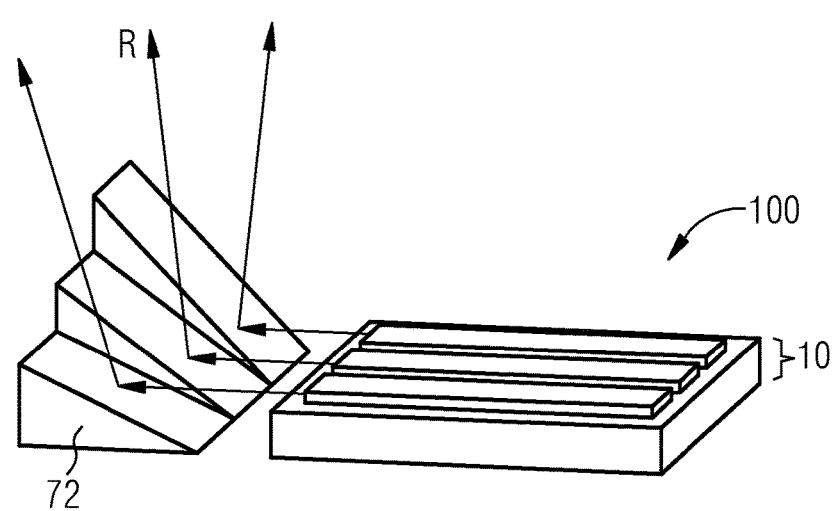
Figure 5B:
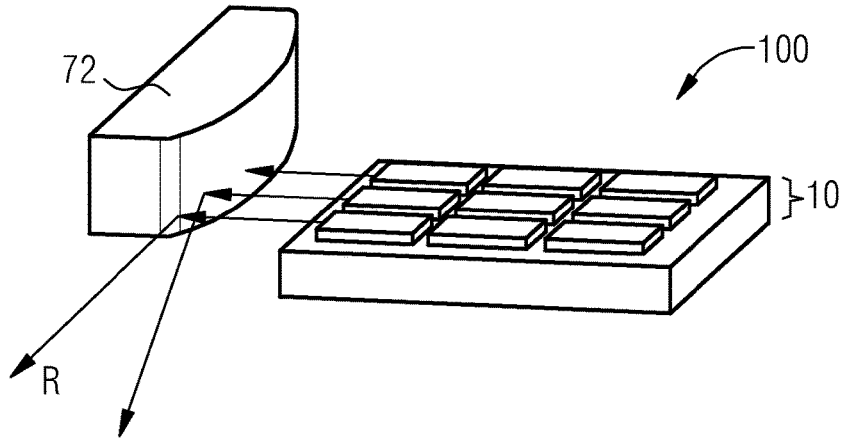
Figure 5C:
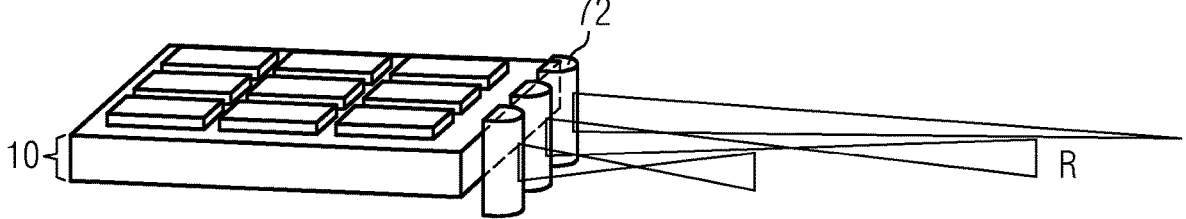

FIGS. 5A, 5B, and 5C each show a component device 100 having an optical element 72 and a component 10 on a carrier 9. The optical element 72 may be a lens, a lens system, a prism, or a system of prisms. In particular, the optical system 72 is configured to redirect radiation emitted from the component 10. The component 10 may be combined with an optical element 72 that is particularly configured to reflect the emitted light at different angles. Depending on which segments 40 are electrically activated or electrically controlled, a predefined angular range can be illuminated. In addition to prisms, round or square optical elements can also be used, which show different reflection angles depending on the angle of incidence. For example, lenses especially with different focal lengths can be used for beam focusing. Also, the lenses can be arranged at different distances from the component 10. A focus point of the laser beam can be varied by controlling the appropriate segments 40, and can be tracked for moving parts. The emitted light can thus be reflected, deflected or focused downwards, upwards, forwards, backwards and/or sideways. In this way, angular areas can be illuminated in a targeted manner, for example in headlights, or scanned in a targeted manner, for example in lidar systems.

Figure 6A:
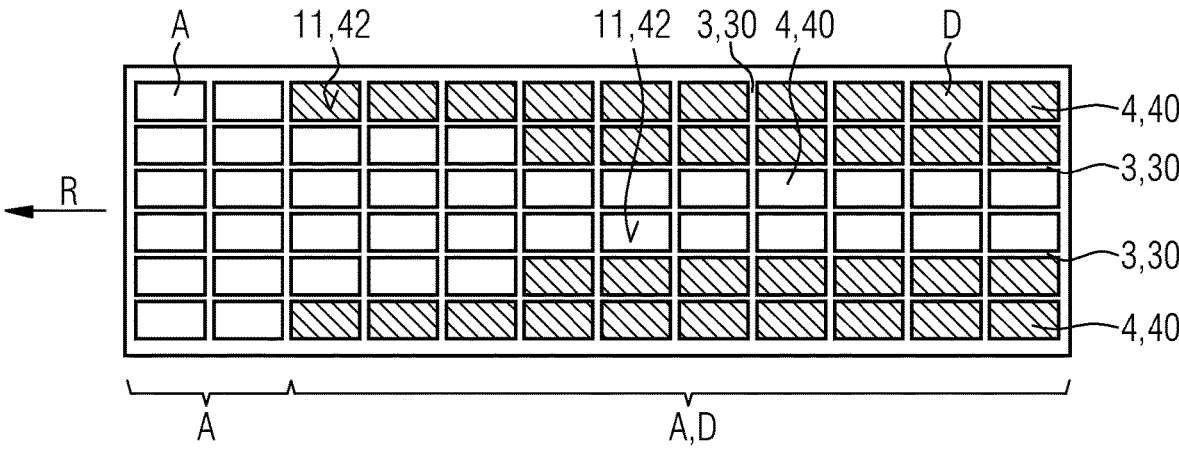
FIGS. 6A, 6B, 7A, 7B, 7C, 8A, 8B, 8C, 9A, 9B, 9C, 9D, 10A, 10B, 11A, 11B, 11C, 11D, 11E, and 11F show schematic representations of some modes of operation of the component based on electrical contacts on the connection surface.

FIG. 6A shows the component 10 in operation, wherein a group A of segments 40 is electrically activated and another group D of segments 40 is electrically not activated. By activating segments 40 of group A in a trapezoidal shape, a particularly good radiation characteristic of a narrow emitter (right) can be combined with a comparatively large area of a wide emitter (left). Due to the trapezoidal transition to the facet, i.e. to the radiation exit surface, a basic mode radiation characteristic can be maintained at high power.

Figure 6B:
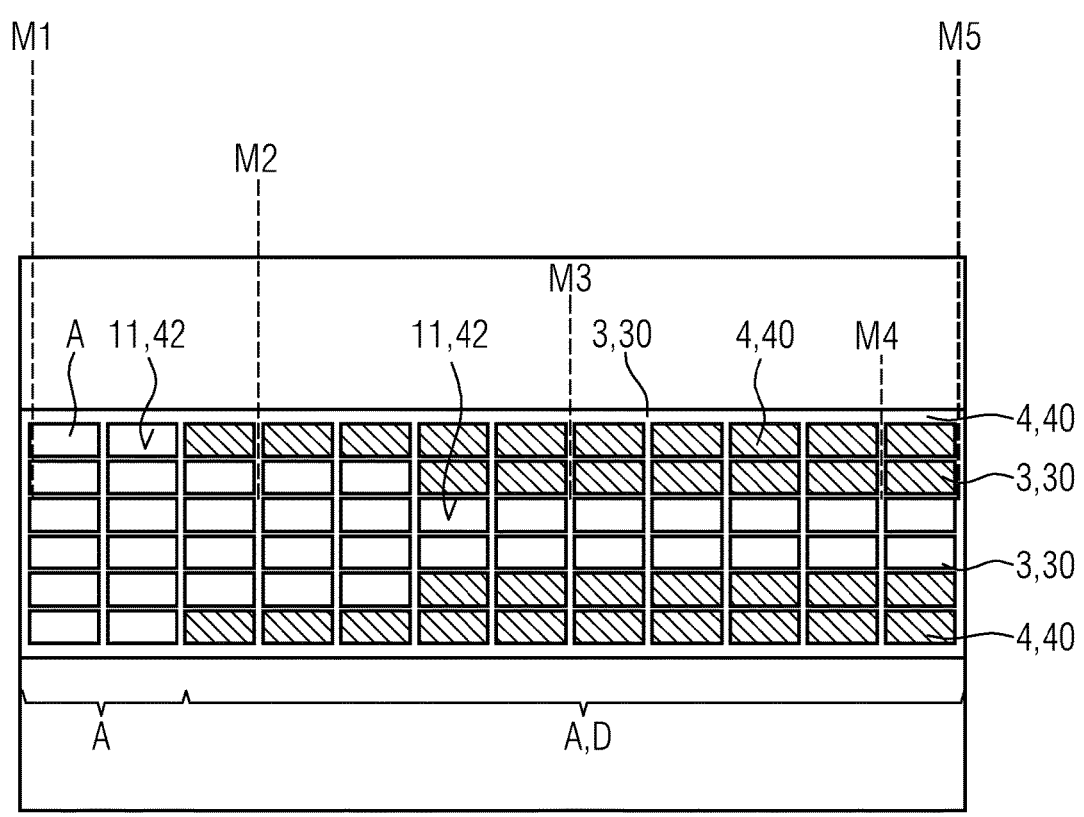

By the so-called 2D-pixelation of the connection surface 11, a resonator length of the component 10 can be varied in a simple way. In FIG. 6B, possible splits of a component 10 are shown schematically. For example, a split between line M5 and line M1, M2, M3 or M4 can be used to produce a lateral monomode laser with a full trapezoidal section, a lateral monomode laser with a short trapezoidal section, a long ridge laser or a short ridge laser. However, a component 10 shown as in FIG. 6A or 6B can also be operated in different modes M1 to M4.

In order to obtain a suitable resonator length, the component 10 can thus be split at the appropriate point, defining a desired facet of the component 10. This means that after chip production, not only the shape and type of a component, in particular a laser component, but also the choice of resonator length can be varied. The choice of shape, type and especially resonator length can positively influence the yield of chips on the wafer, possible output powers, spectral mode spacings, threshold current densities, emission wavelengths, etc.

Figure 7A:
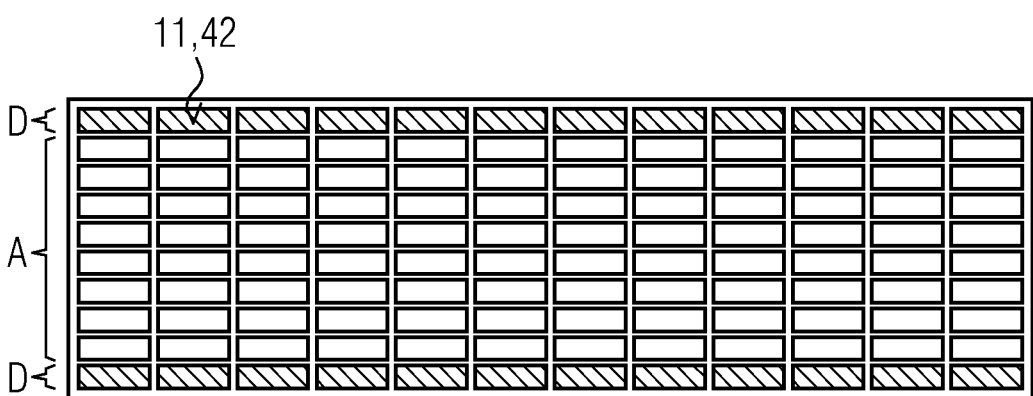
Figure 7B:
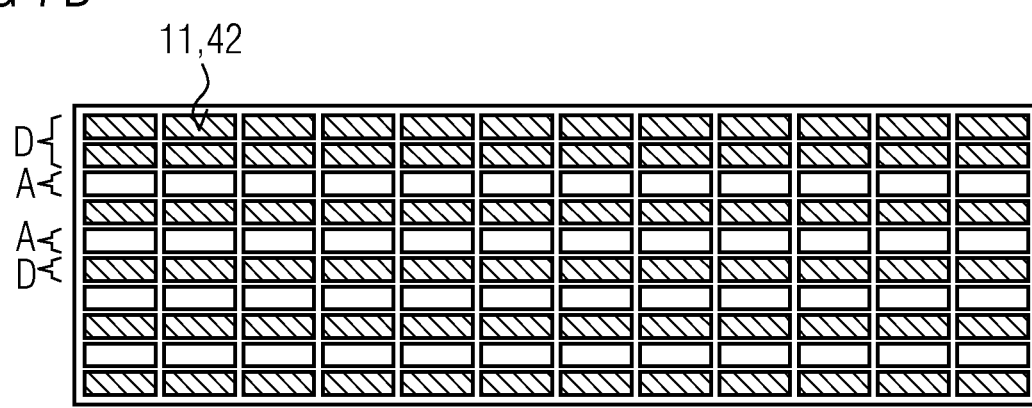
Figure 7C:
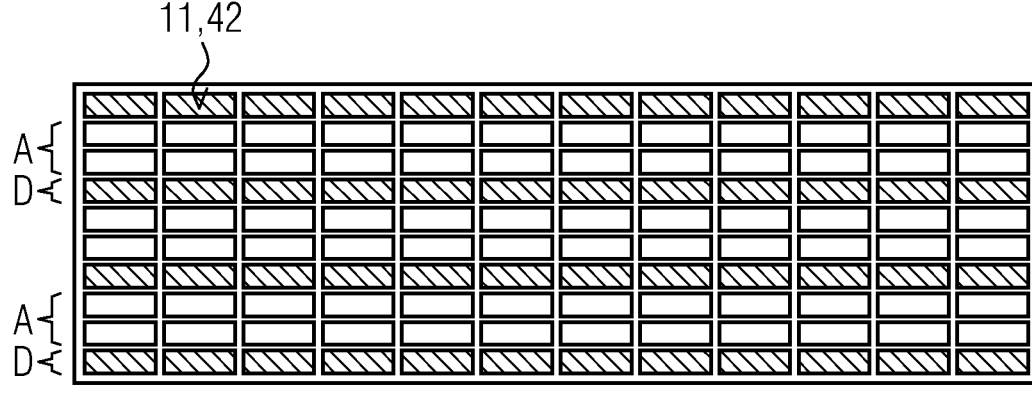

FIGS. 7A, 7B and 7C show various operating modes of a component 10 which is formed in particular as a controllable power laser, for example in the form of a laser array or in the form of a broad-strip laser. In the operation of such a component 10, a group A or D as well as a plurality of groups A or D can be electrically activated or deactivated. In particular, this allows a width of a wide stripe reader or a stripe spacing of a laser array to be adjusted via the pixelated contact structure 4. In this way, both the optical output power and the optical far field can be easily adapted to the respective application, for example, with collimator lenses, lens arrays, fiber diameters, etc.

Figure 8A:
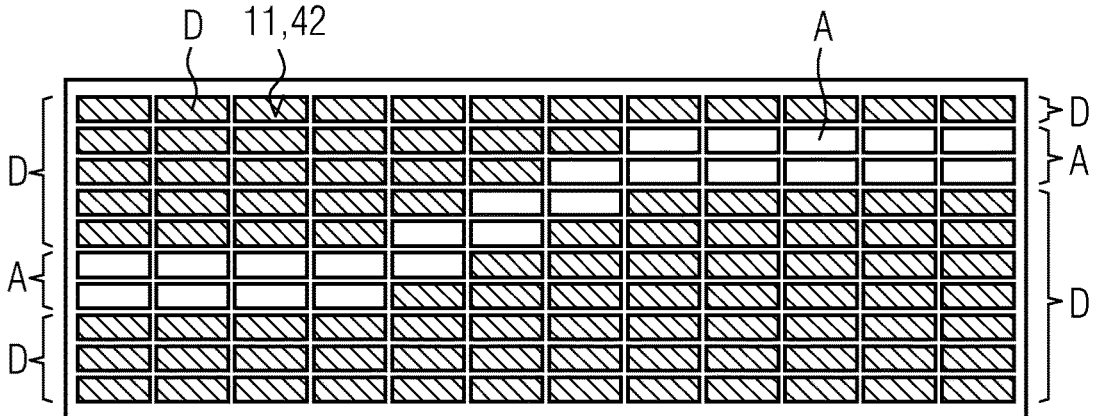
Figure 8B:
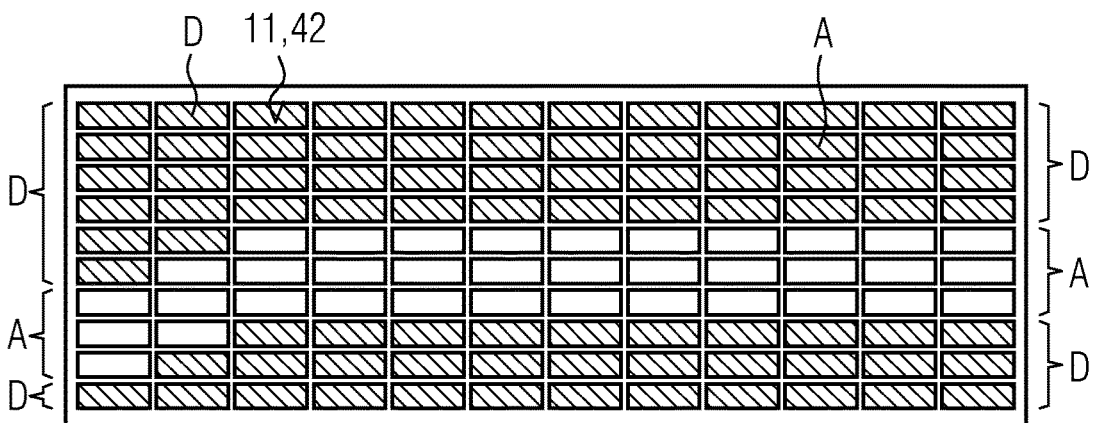
Figure 8C:
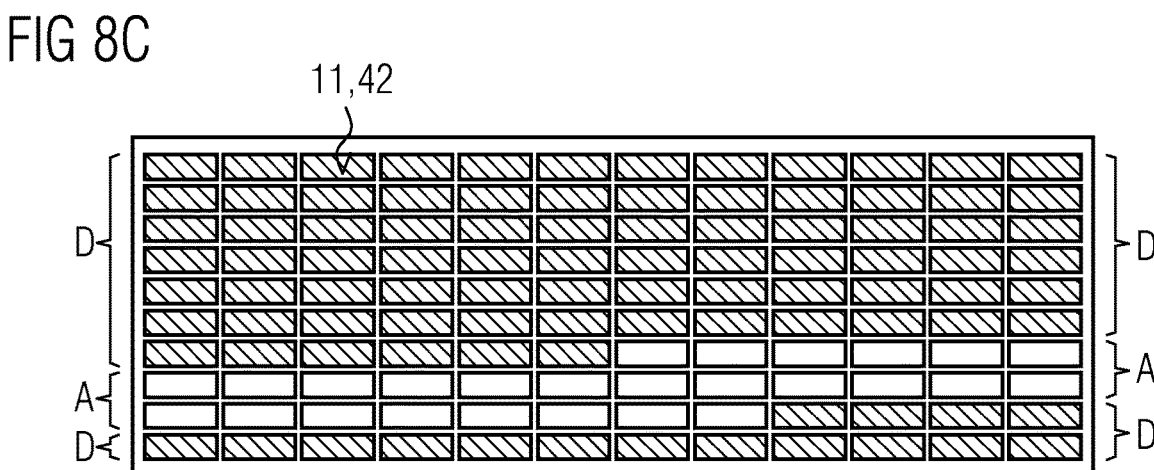

FIGS. 8A, 8B, and 8C illustrate other modes of operation of a component 10, such as an adjustable superluminescent diode. In particular, this component 10 is operated as an individually adjustable edge-emitting LED or SLED. The operating current and output power are controllable by the number of electrically activated segments 40. The feedback, namely the laser component to the LED component, and the line width are controllable in particular via the positions of the electrically activated segments 40. According to FIGS. 8A to 8C, such a component 10 is in particular switchable between a lateral monomode ridge component and a SLED component in particular with different angles of curvature.

Figure 9A:
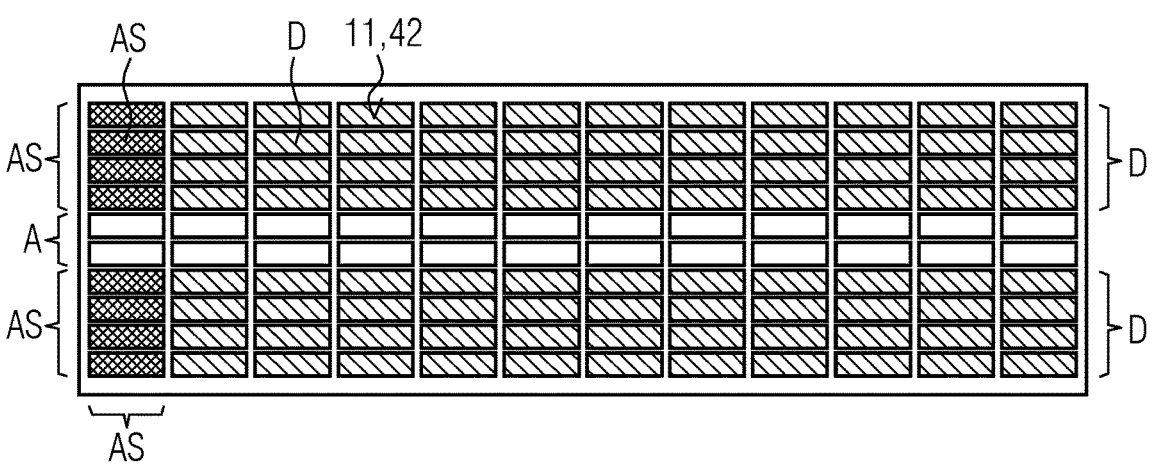
Figure 9B:
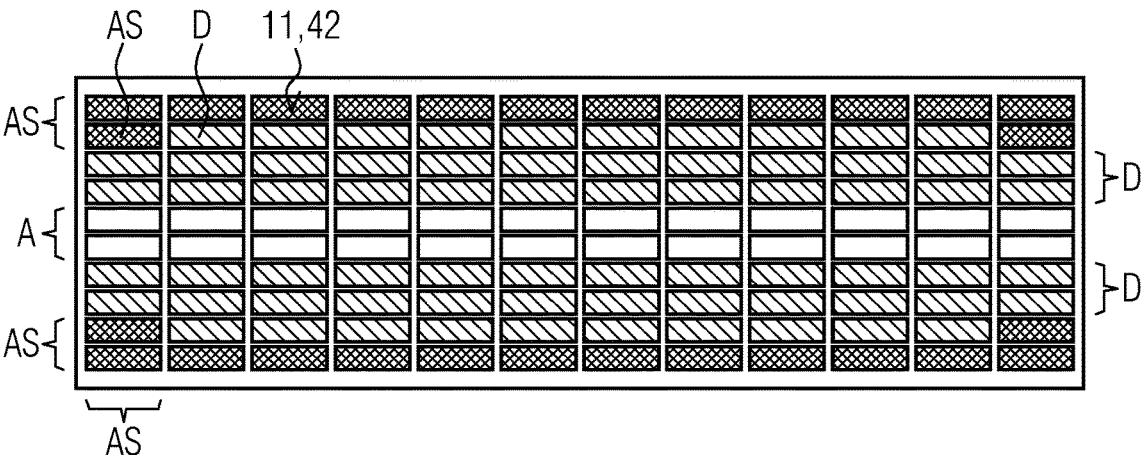

FIGS. 9A and 9B show other modes of operation of a component 10, wherein some segments 40 of group AS are operated in the reverse-biased direction to form absorbing regions. Radiation is generated in the immediate vicinity of the group A segments 40 operated in the forward-biased direction. To improve beam quality, additional segments 40 of group AS can be operated in the reverse-biased direction, forming absorbing regions especially near the facet (FIG. 9A) to minimize stray light in the far field. According to FIG. 9B, absorber strips can be formed which are arranged on the edge of the connection surface 11. Such absorber strips can suppress an expansion of the laser beam or the ring modes in the resonator.

Figure 9C:
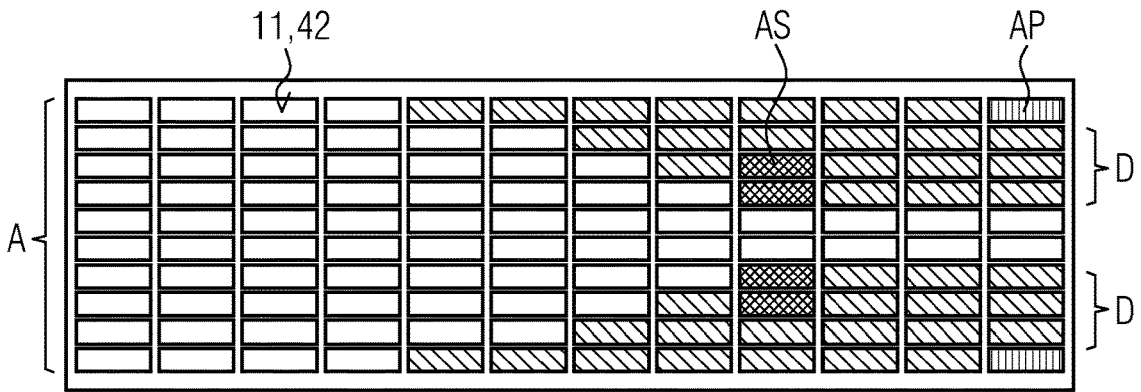
Figure 9D:
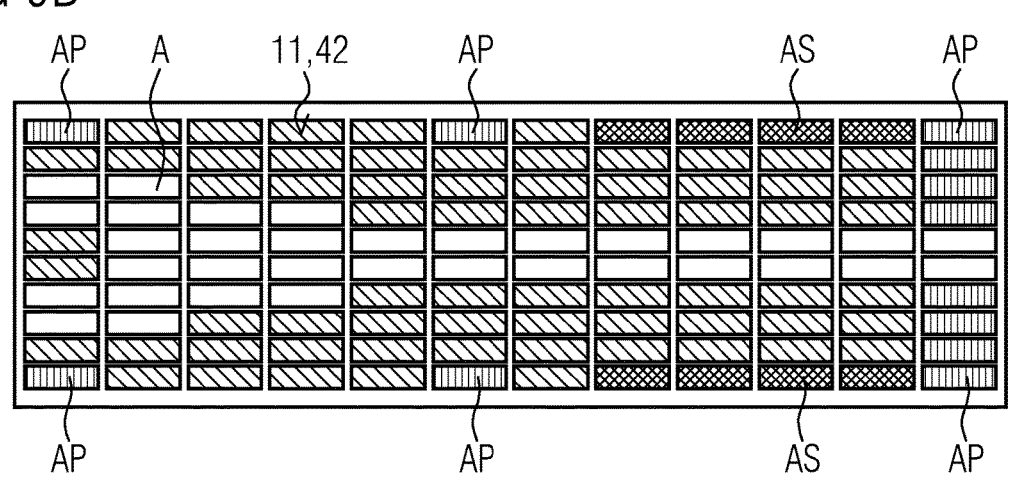

FIGS. 9C and 9D show further positions of segments 40 of group AS operated in the reverse-biased direction. Further segments 40 of the group AP can be operated as a detector. As a result, a photocurrent can be measured at these segments 40, so that a conclusion can be drawn about the power standing in the resonator. Based on these measured values, further segments 40 can be switched on or off, for example, in order to control the power, resonator length and/or radiation characteristics.

It is possible for a component device 100 to have multiple components 10, such as at least three, four, six, or at least eight components 10. Such components 10 are shown schematically, for example, in FIGS. 2A through 2G and 6A through 9D. In operation of the component device 100, the components 10 may be operated in the same mode of operation or in different modes of operation.

Figure 10A:
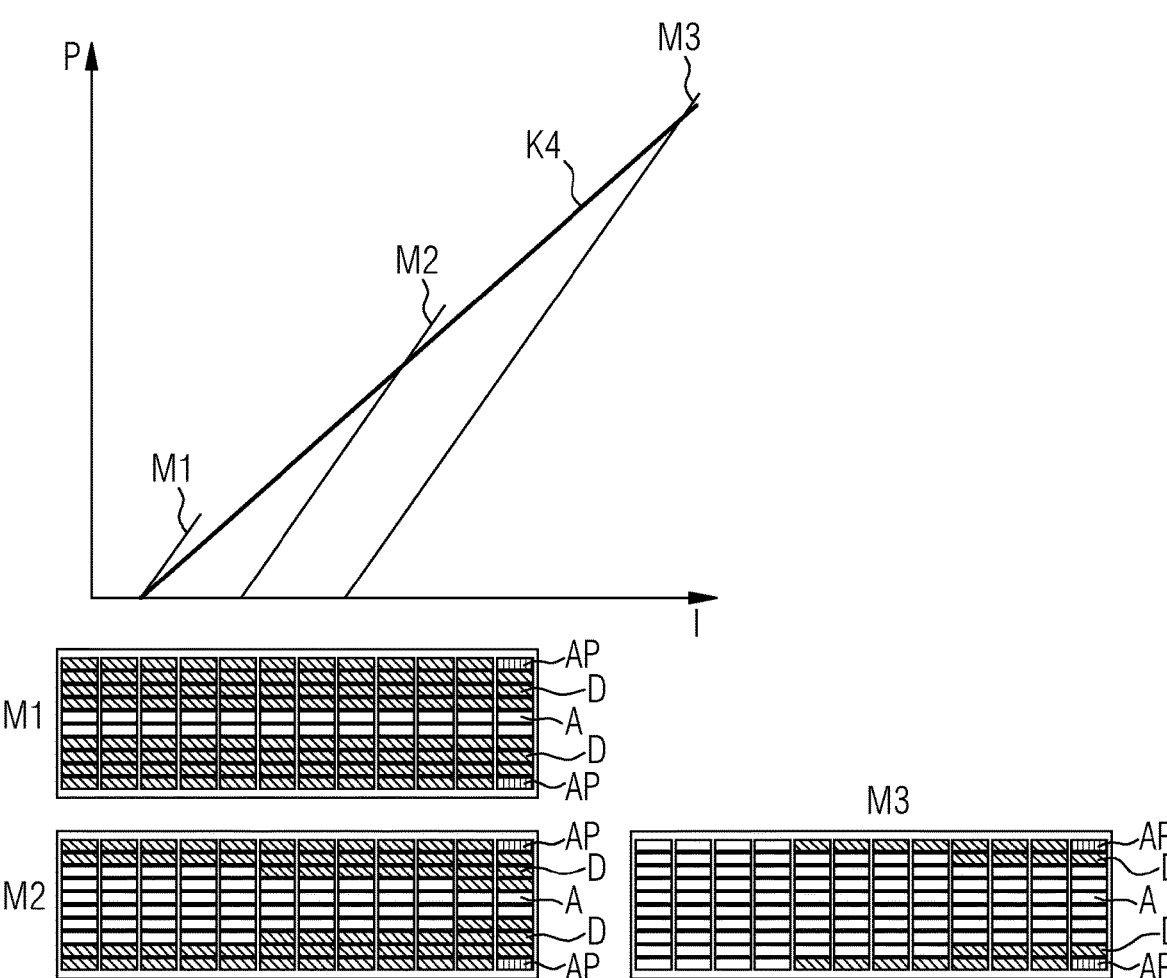

FIG. 10A shows a characteristic curve K4 in a power P current I diagram. During operation, the component 10 can be operated in several operating modes to obtain an optimum characteristic curve K4. In order to set optimal conditions in the component 10 adapted to the operating time, different segments 40 can be switched on during the operating time. For low power and low threshold, only a few segments 40 are switched on (operating mode M1). To achieve increased efficiency compared to, for example, a broad-area laser, additional segments 40 are switched on for higher powers (M2 operating mode). For very high powers, further segments are again activated electrically (operating mode M3). Overall, this results in the optimized characteristic curve K4, which can be set to the optimum efficiency as far as possible at each operating time.

Figure 10B:
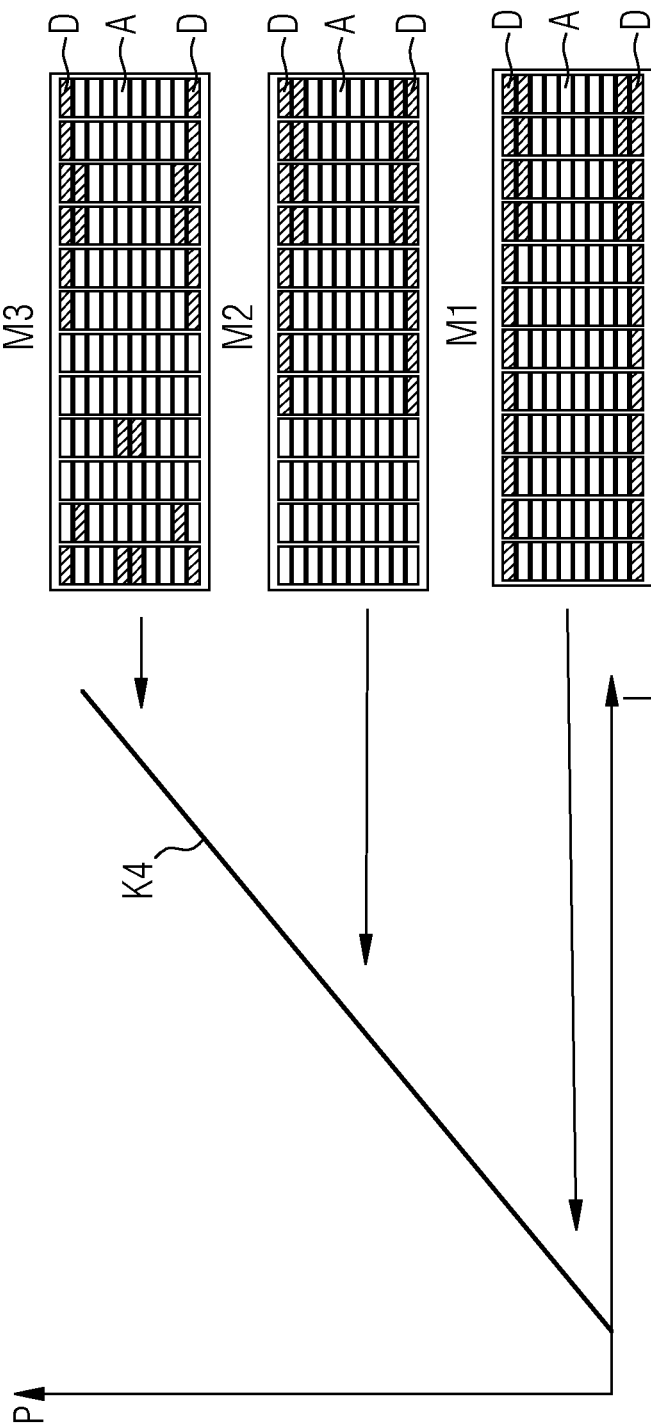

Analogous to FIG. 10A, FIG. 10B shows a further optimized characteristic curve K4 for a component 10 which functions in particular as a broad-area laser in operation. In the case of broad-area lasers, the radiation characteristic can change due to thermal effects, charge carrier effects depending on the operating point. This makes it difficult to achieve, for example, coupling of the emitted laser beam into a fiber with constant efficiency. Therefore, depending on the operating point, different segments can be switched on or off in order to be able to influence different thermal conditions during the operation of the component 10. In particular, according to the operating mode M3, undesired thermal lensing or hotspots can be suppressed. With the schematically shown operating modes M1 to M3, the far field of a component 10 can be adjusted.

Figure 11A:
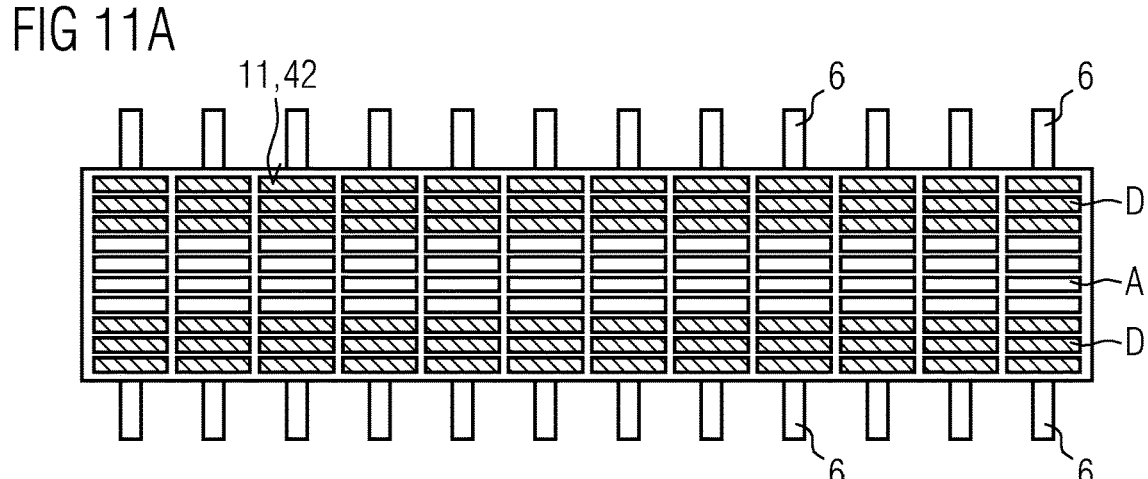
Figure 11B:
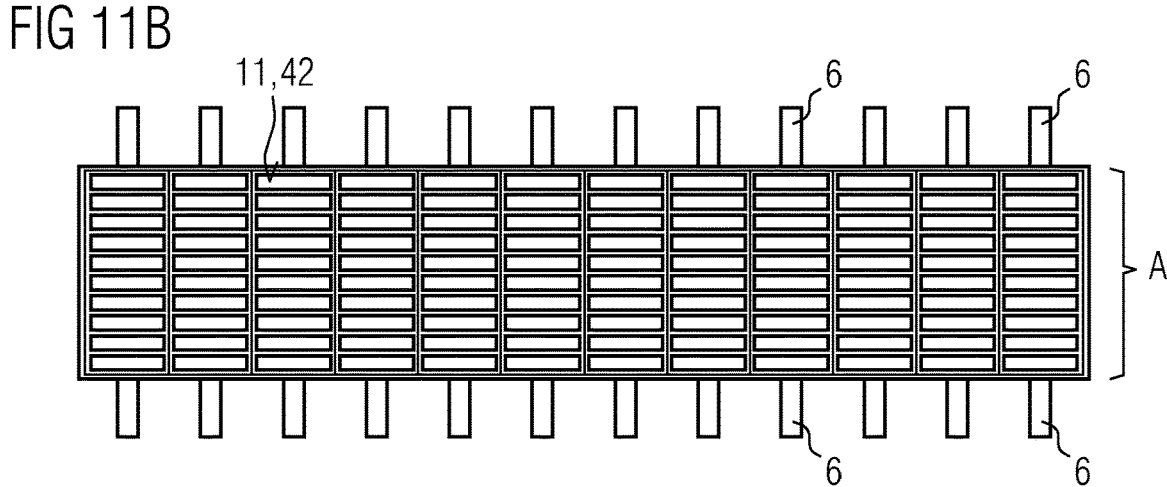
Figure 11C:
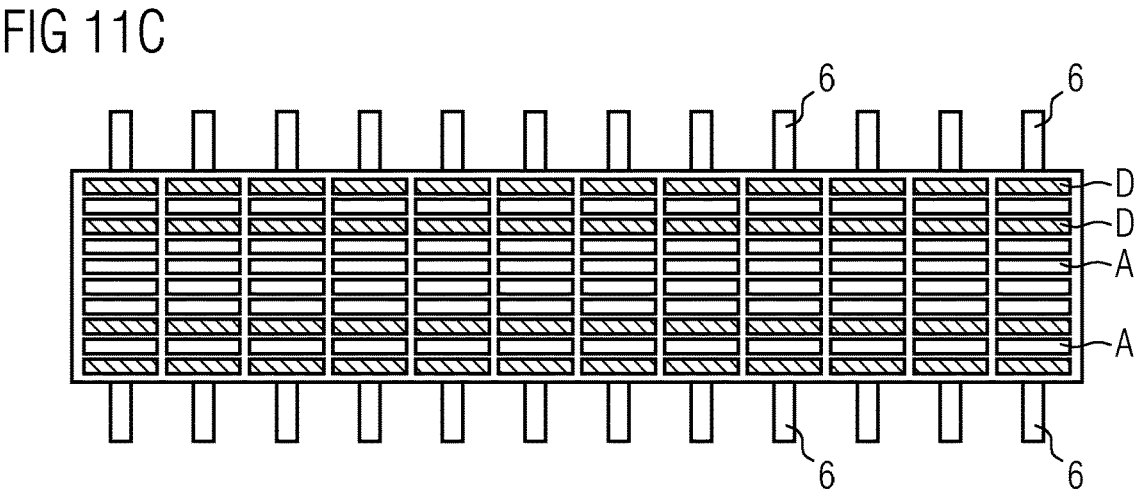
Figure 11D:
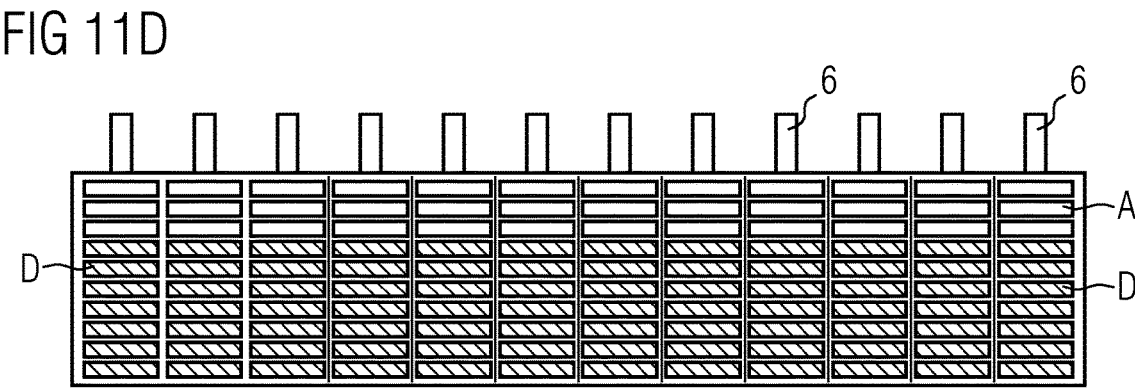

The exemplary embodiment shown in FIG. 11A is essentially the same as that of the component 10 shown in FIG. 2A, except that the component 10 has a plurality of elements 6 for wavelength stabilization. The elements 6 can be arranged on both opposite edges (FIG. 11A) or on only one edge (FIG. 11D) of the connection surface 11, the contact region 24 or the ridge region. In particular, the elements 6 form a so-called DFB grid. If only the segments 40 in the center of the connection surface 11 are electrically activated (FIG. 11A), the coupling to the elements 6 is low and it is possible that the wavelength is not sufficiently stabilized. If the lateral segments 40 are added, the coupling increases and the wavelength can be sufficiently stabilized (FIG. 11B). Switching between longitudinal monomode radiation and multimode radiation can also be realized with the elements 6 and suitable activation of the segments 40 (FIGS. 11A to 11C).

It is also possible to have a one-sided DFB grating and to move the wave within the resonator towards the grating (strong coupling to the grating) or away from the grating (weak or no coupling to the grating). It is also possible to fabricate the elements 6 directly based on the patterned connection surface 11.

Figure 11E:
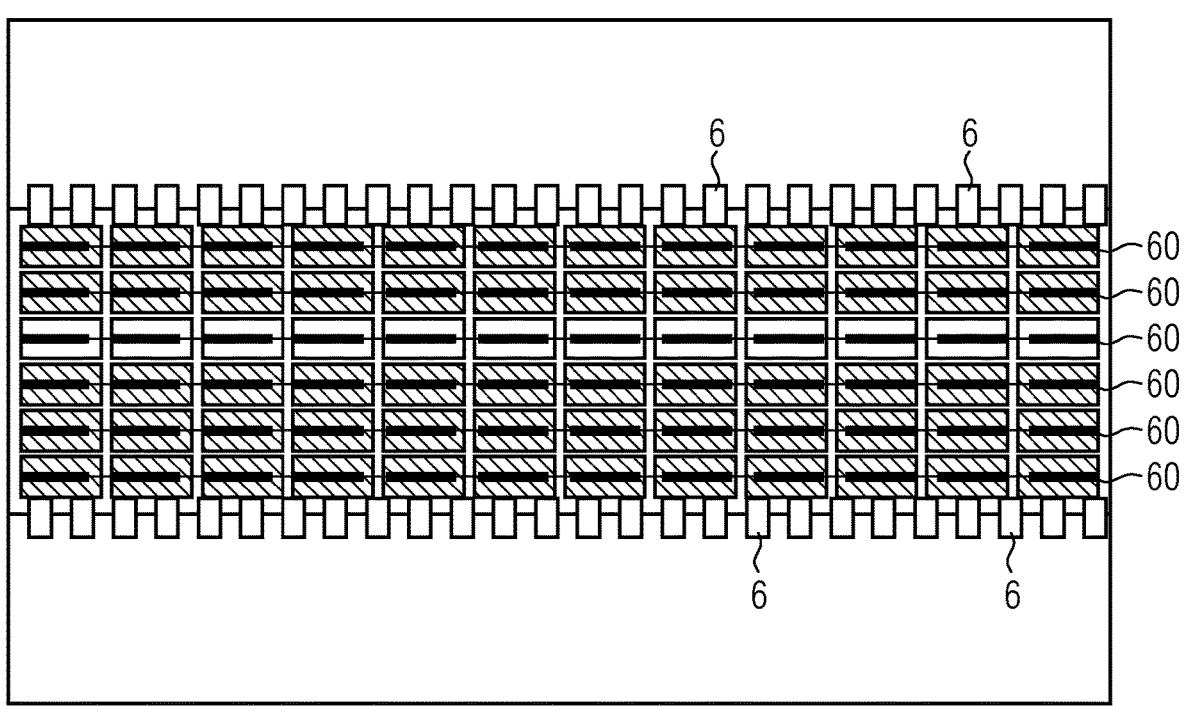

The exemplary embodiment shown in FIG. 11E corresponds essentially to that of the component 10 shown in FIG. 11A. In contrast, the component 10 is formed in particular as an array of individually controllable, for instance laterally single-mode ridge lasers. Such a component 10 can have separation trenches 60 which are shown schematically in FIG. 3B or 12, for example. In such an embodiment, individual ridge regions can be switched on and off with the elements 6 or without the elements 6.

Figure 11F:
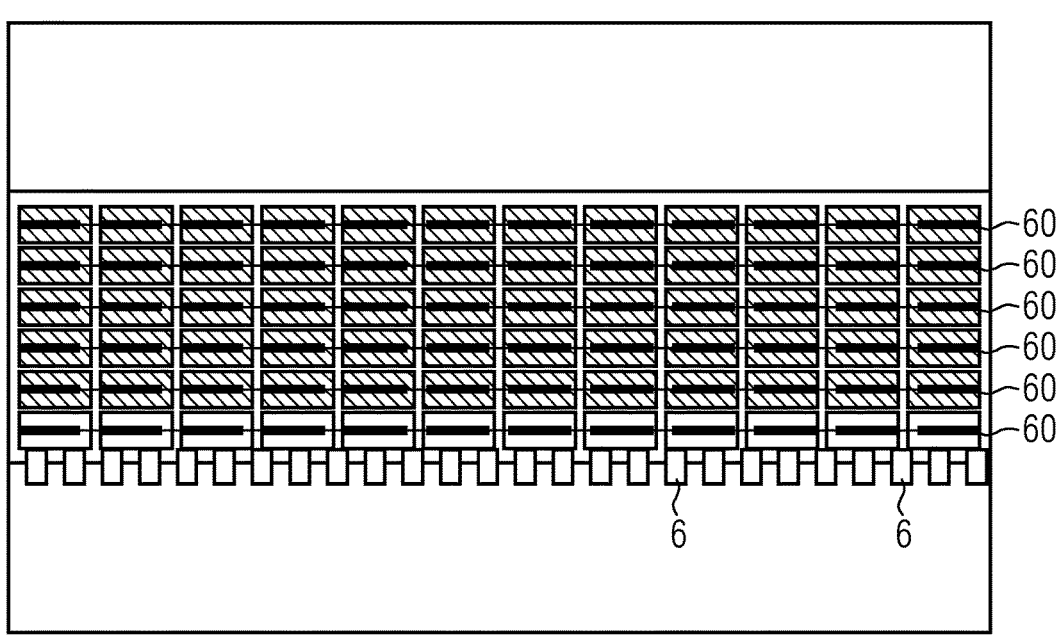

The embodiment shown in FIG. 11F corresponds essentially to that of the component 10 shown in FIG. 11E. In contrast, the elements 6 are arranged only on one edge of the connection surface 11. The component device 6 thus has, in particular, a one-sided DFB grid structure. It is possible that each ridge region has a DFB grating with a different period. Thus, different longitudinal modes can be mixed. This also applies to component 10 with DFB grating structures arranged on both sides.

Figure 12:
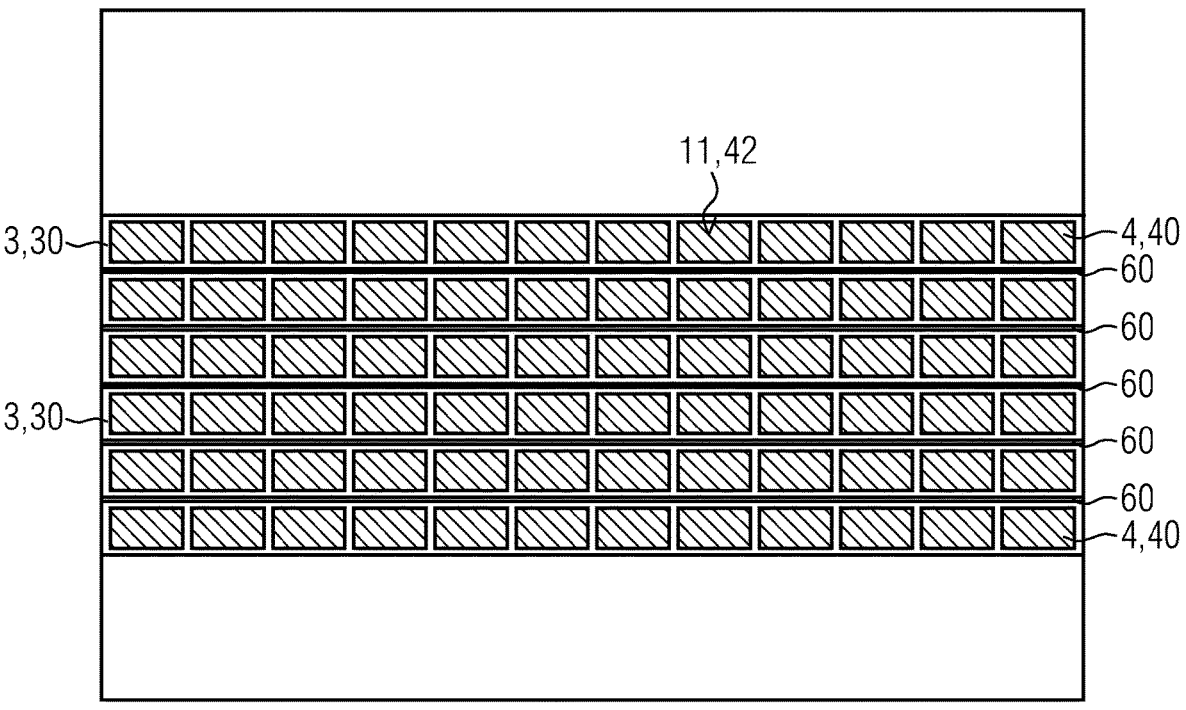
FIG. 12 shows schematic representation of a further exemplary embodiment of a component in top view of the connection surface.

FIG. 12 shows a component 10 which in particular has several rows of ridge regions. Such a component 10 is also shown schematically in FIG. 3B. The main body 2 may have a semiconductor body which, at least in places, is not formed to be continuous, but has separation trenches 60 along lateral directions. Such separation trenches 60 may be depth trenches, which may be formed by plasma etching, for example. The separation trenches 60 separate the different ridge regions from each other. This has the advantage of reducing or preventing electrical crosstalk between the individual segments 40 or the individual pixels. If the ridge regions are close enough to each other, optical coupling of the light fields is possible. Thus, a laser array can be formed. Hence, an optical, lateral basic mode of the light field can be enabled even for large ridge widths and high output powers.

Figure 13A:
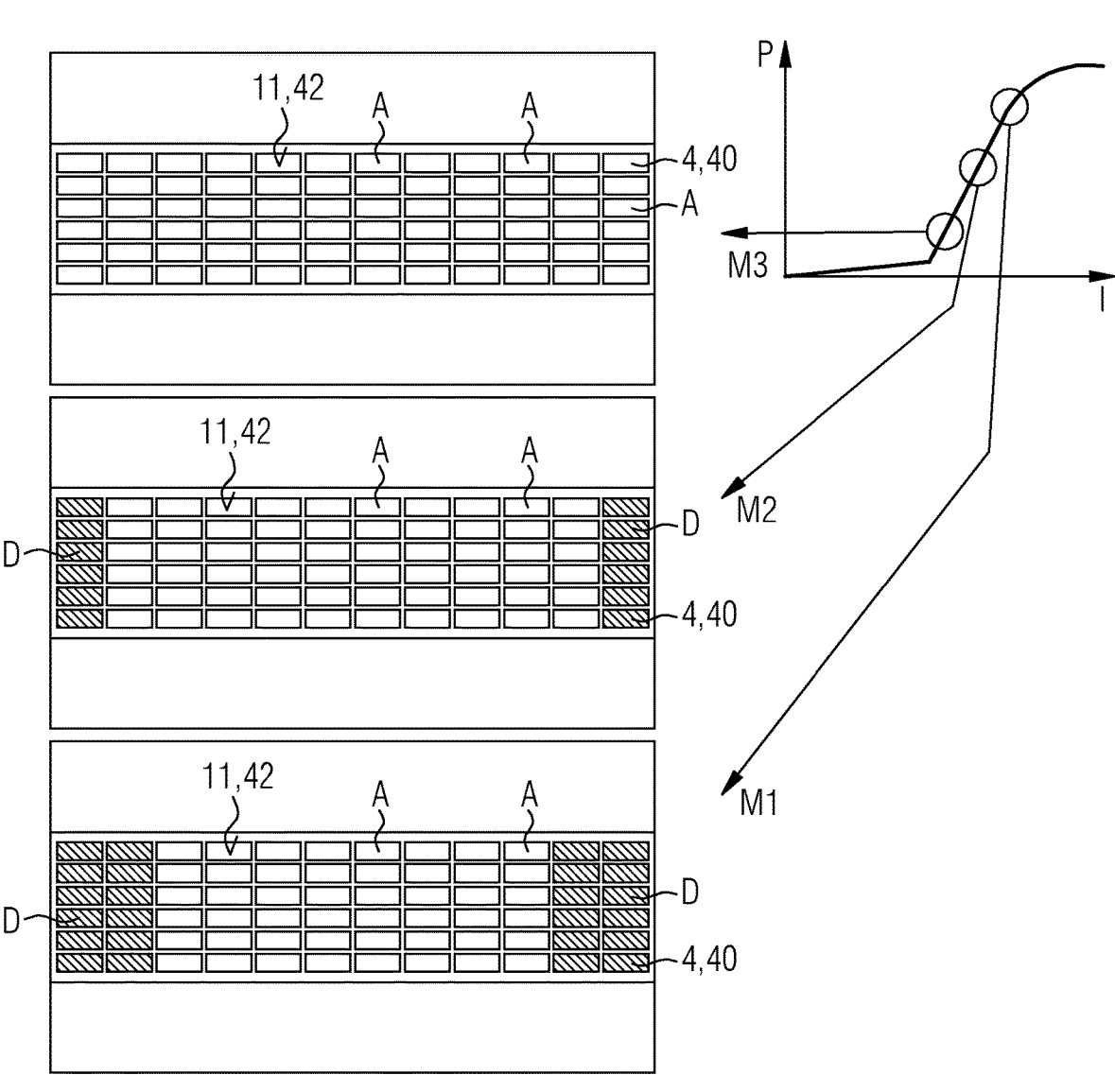
FIGS. 13A, 13B, 14A, 14B, 14C, 14D, and 14E show schematic representations of some modes of operation of a component or a component device comprising a component based on different electrical contacts on the connection surface.

FIG. 13A shows the adjustable facet current of a component described here, which is operated as a laser in operation. FIG. 13A shows: an operating mode M1 comprising two columns of segments 40 at each facet being not electrically activated; an operating mode M2 comprising only one column of segments 40 at each facet being not electrically activated; and an operating mode M3 comprising all segments 40 being electrically activated.

By shutting the down regions on the facet, which in particular is formed as a radiation passage surface of the component 10, the reliability of the component 10 can be increased. Thus, during operation of the component 10, all segments 40 can be operated, particularly at low powers, to achieve a minimum threshold and maximum efficiency. At higher powers, the segments 40 at the facet may be partially operated or not operated, for example, to keep the temperature at the facet low or to lower the temperature at the facet. This is useful not only at different output powers, but also at different temperatures to achieve reliability of the component 10 in operation.

Figure 13B:
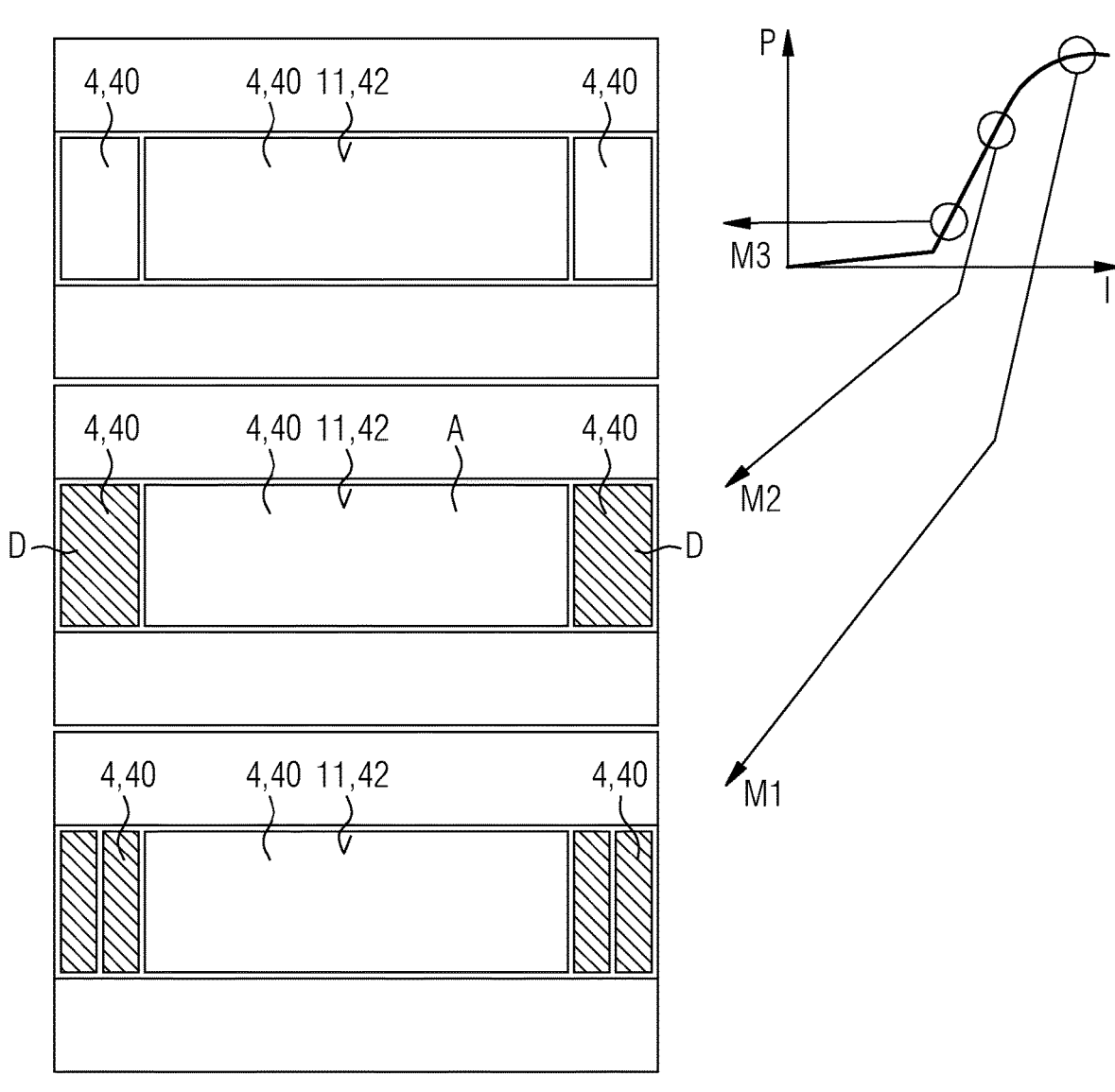

The illustration in FIG. 13B corresponds essentially to the illustration in FIG. 13A. In contrast, the segments 40 are formed differently. In particular, for high power lasers, a large segment 40, which may be referred to as the main segment 40H, is located for instance in the central portion of the connection surface 11 or the ridge region. A smaller segment 40 or a plurality of smaller segments 40 is located at the facet area, which may or may not be electrically activated depending on operating conditions, such as in terms of powers or operating temperatures. Thus, an optimum between efficiency and reliability of the component 10 can be achieved.

Figure 14A:
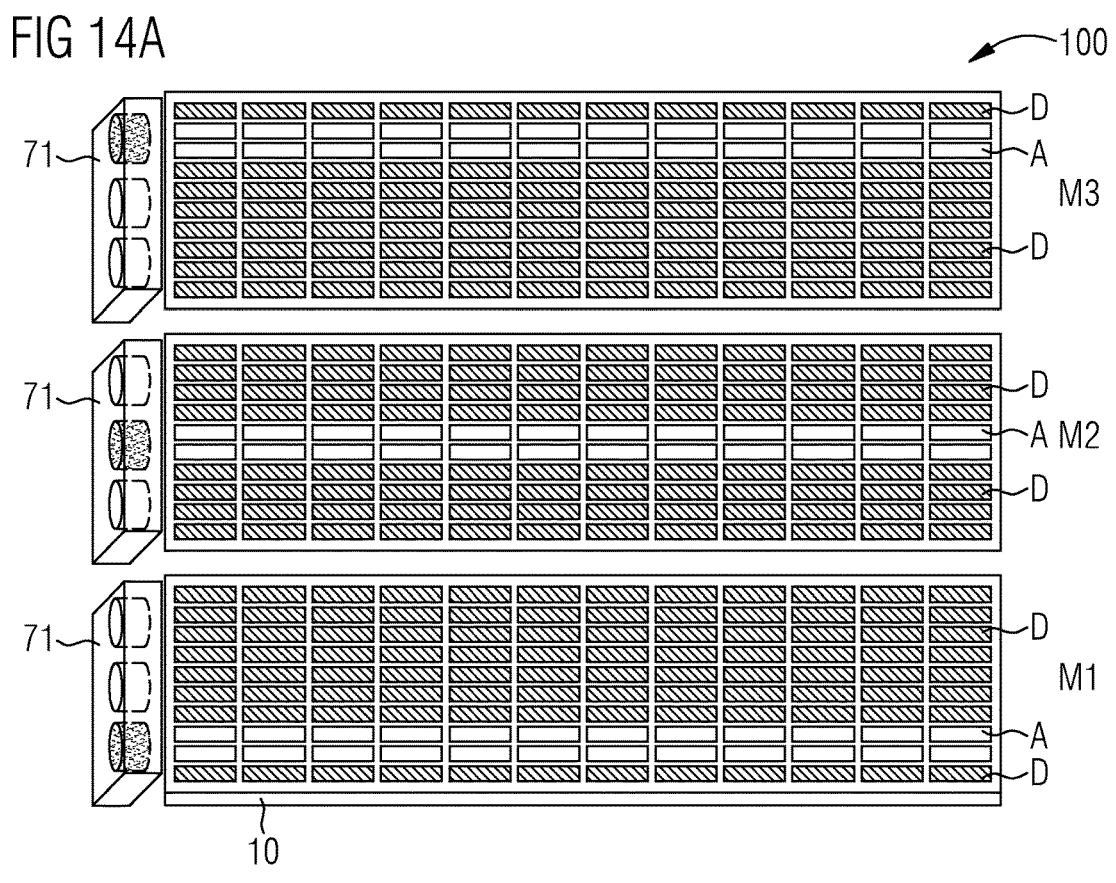

FIG. 14A shows a component device 100 comprising a component 10 and a converter 71. The converter 71 may have different phosphors in different areas. This component device 100 represents a controllable laser converter unit, as a result of which the different phosphors can be selectively excited via the individual controllable segments 40. For example, the converter 71 has three different regions configured to convert the radiation emitted by the component into red light, green light and blue light. Such a component device 100 thus represents an individually adjustable 1-chip RGB light source. Alternatively to a blue converter, the blue emission of the component 10 can be used directly. Alternatively or additionally, other phosphors, for example yellow or cyan phosphors, may be used.

The output power of the component device 100 can in turn be controlled by the number of electrically activated segments 40. In addition, passive mounting of the converter 71 or the microobjects is possible, since the optimization of the light path is performed by controlling the segments 40. On the one hand, the light sources can be micro light sources. On the other hand, they can be combined with monomode lasers, high-power lasers, power lasers, laser arrays or laser bars.

Figure 14B:
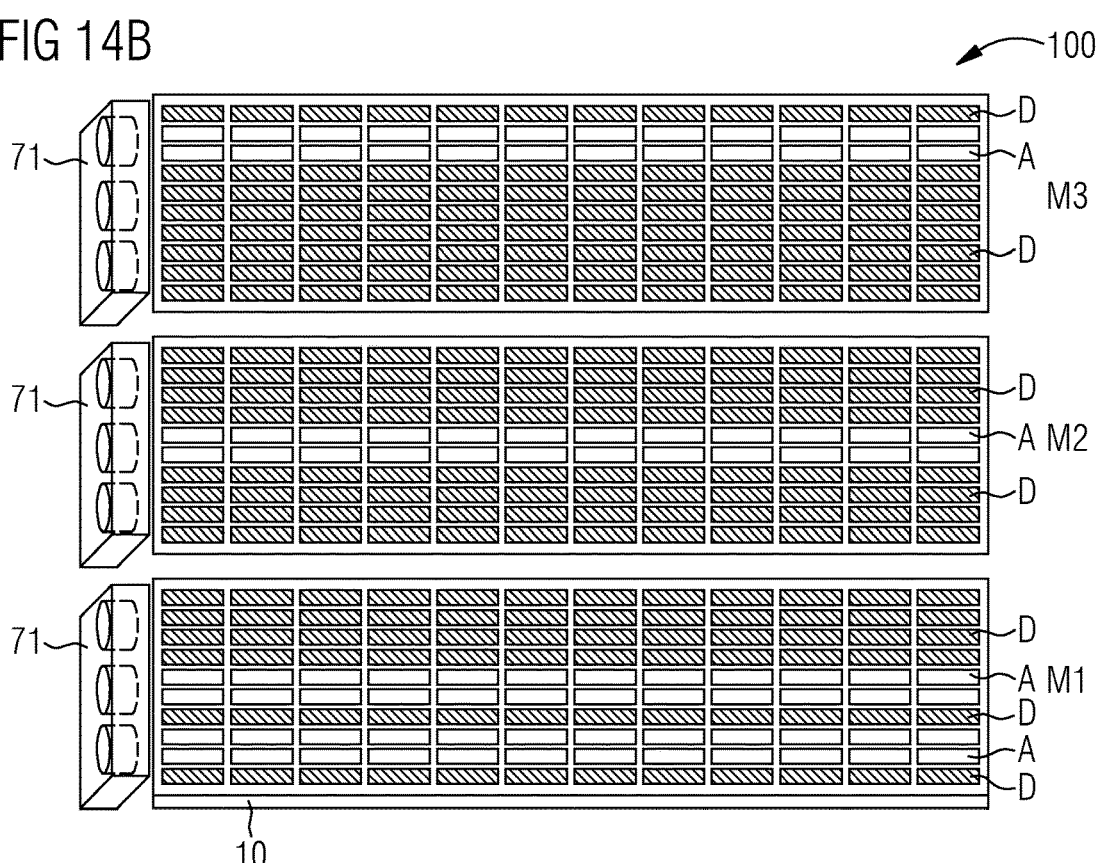

FIG. 14B shows a component device 100 which is configured as a controllable laser converter unit, in particular as a 1-chip white light source with controllable color location. Different areas of the converter 71 can be excited via the individually controllable segments 40, which in particular have different white converter phosphors, for example from cool white to warm white. The phosphors may be embedded in a thermally conductive matrix, such as AlN, or may be disposed on a radiation-transmissive body, such as a sapphire lens. The color location or output power of the component device 100 may be adjusted by the number and/or by the positions of the electrically activated segments 40 and/or by the current intensity in the active segments 40. In all embodiments, it is possible that the current intensity in the active segments can be adjusted. In particular, it is possible that each individual segment 40 can be operated at a different current intensity in flux or reverse voltage. This allows for much finer adjustment of the mode profile.

Figure 14C:
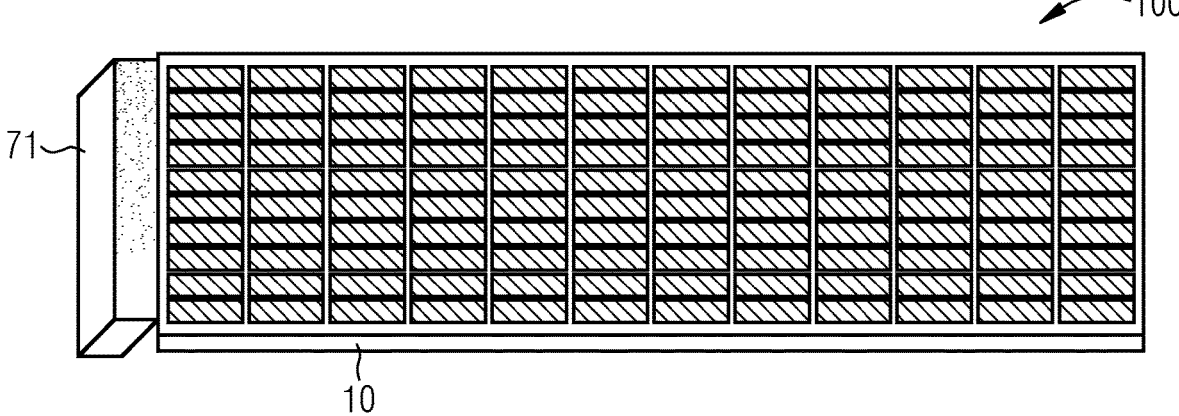
Figure 14D:
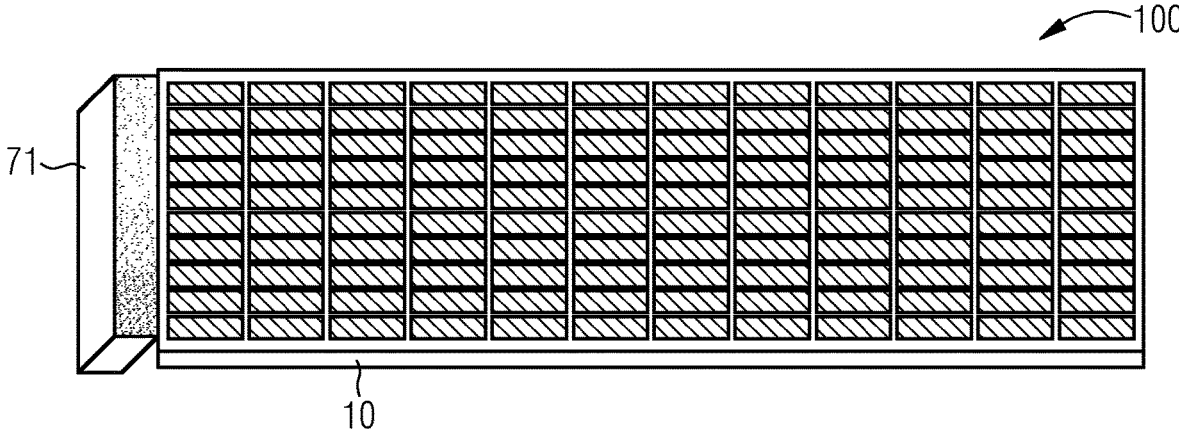
Figure 14E:
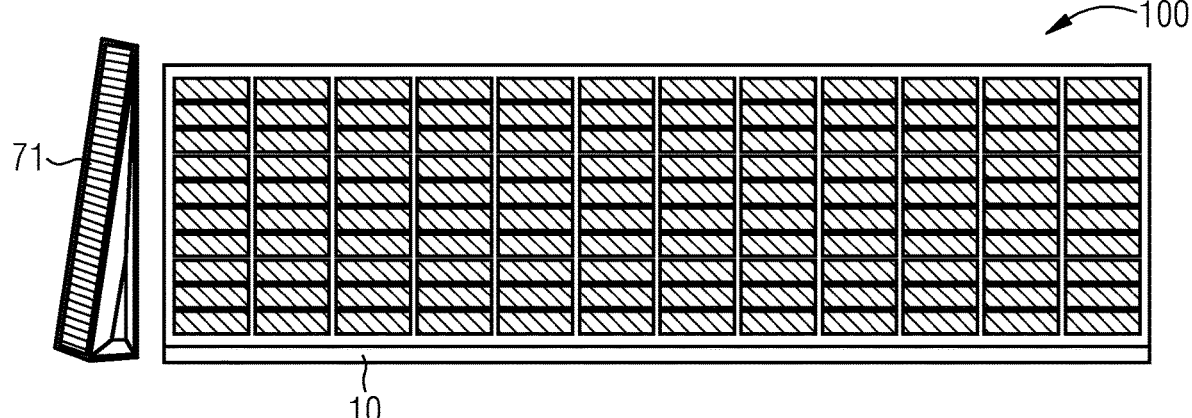

Further implementations of the converter 71 are shown schematically in FIGS. 14C, 14D and 14E. According to FIG. 14C, the color gradient of the converted radiation can be adjusted by different high concentrations of the phosphors in different regions of the converter or in the matrix material of the converter. According to FIG. 14D, a gradual transition of the phosphors with respect to their concentration in the converter 71 is possible. Different color locations of the converted radiation can also be achieved by the converter 71, which according to FIG. 14E is formed as a converter plate with different layer thicknesses in different areas of the converter 71. It is also possible that the converter 71 is stepped and thus has step-like structures in places.

With a component described herein, instead of a design-related compromise in the component, the configuration of the component, in particular of the laser, can be optimally adjusted for each operating time. For example, at low currents, only a narrow part of a laser stripe can be operated at a low laser threshold, while at higher powers, another part of the laser stripe is energized, allowing increased optical output power and reduced facet loading.

The flexible adjustment option of the component allows a wide range of applications to be covered. For example, medium and high power requirements can be covered with the same component due to the independent electrical activation of different segments of the contact structure. In addition, the component can be operated particularly efficiently by switching in different operating modes. Additional elements such as absorbers, detectors or DFB gratings can be integrated into the component in a flexible and switchable manner, allowing the component to be switched to different operating modes in a simple manner. In addition, the radiation characteristics of the component can be adapted to the respective working area, for example by switching on or off absorbing areas of the main body. In addition, thermal effects can be compensated for, allowing higher brilliance or a better beam parameter product to be achieved. By selectively activating the segments, the facet load limit and component stability can also be increased.

The invention is not restricted to the exemplary embodiments by the description of the invention made with reference to the exemplary embodiments. The invention rather comprises any novel feature and any combination of features, including in particular any combination of features in the claims, even if this feature or this combination is not itself explicitly indicated in the patent claims or exemplary embodiments.

The invention claimed is:

1. A component comprising a main body and a contact structure, wherein the main body comprises an active zone which, at least in regions, is configured for generating electromagnetic radiation during operation of the component, the contact structure comprises a plurality of individually controllable segments, the component comprises a connection surface and a side surface, wherein the side surface extends transversely to the connection surface and is formed as a radiation passage surface of the component, the connection surface is formed in a structured manner, wherein the connection surface is defined by internal common interfaces between the main body and the contact structure, and wherein the segments each comprise a local common interface with the main body and are configured for injecting current into the main body in a pixelated manner, the component has a passivation structure which is configured for electrically insulating the segments from one another, the structured connection surface having surfaces of the passivation structure and surfaces of the individually controllable segments, the passivation structure comprises at least one sub-layer, the sub-layer is located between two adjacent segments of the contact structure in a vertical direction as well as in a lateral direction, and the contact structure has at least two adjacent L-shaped segments, the adjacent segments being arranged one above the other in regions as seen in plan view of the main body and thus having overlaps as seen in plan view.

2. The component according to claim 1, wherein the segments are spatially spaced apart from one another in lateral directions by intermediate regions and are thus pixelated in two lateral directions, the intermediate regions being filled with a gaseous medium and the segments being electrically insulated from one another on account of the intermediate regions.

3. The component according to claim 1, wherein the main body has a transparent electrically conductive contact layer which is directly adjacent to the segments and is electrically conductively connected thereto, wherein the transparent electrically conductive contact layer is continuous, or the transparent electrically conductive contact layer has a plurality of partial contact layers arranged next to one another, each of which is uniquely assigned to one of the segments.

4. The component according to claim 1 comprising different adjustable operating modes, the different operating modes being adjustable by electrically activating different segments of the contact structure, wherein the component simultaneously comprises at least two, three or four of the following modes of operation: component as a ridge laser with a ridge width less than 50 μm; component as a ridge laser with a ridge width greater than 50 μm; component as a tapered laser; component as a laser array; component as a flared waveguide laser; component as a master oscillator power amplifier structure; and component as a superluminescent diode.

5. The component according to claim 1, wherein the segments of the contact structure have contact surfaces which face the main body, are directly adjacent thereto and are defined by the internal common interfaces, wherein the segments are divided into at least two different groups with respect to the contact surfaces, and the segments of different groups have different geometric shapes or different geometric sizes.

6. The component according to claim 1, wherein the segments of the contact structure have contact surfaces which face the main body, are directly adjacent thereto and are defined by the inner common interfaces, the segments being divided into at least two different groups with respect to the contact surfaces, and the segments of different groups having the same geometrical shape but different geometrical sizes.

7. The component according to claim 1, wherein the segments of the contact structure have contact surfaces which face the main body, are directly adjacent thereto and are defined by the internal common interfaces, the contact surfaces of the segments being uniformly distributed on the main body, having the same geometric shape and differing from one another by at most 15% in terms of their geometric sizes.

8. A component device comprising a component according to claim 1 and a carrier, wherein the component is arranged on the carrier and is electrically conductively connected thereto at a contact layer of the carrier facing the component, and the contact layer has a pre-structured geometric shape, does not cover all segments in plan view, is electrically conductively connected only to predefined segments due to the pre-structured geometric shape and thus defines a predefined operating mode of the component.

9. A component device comprising a component according to claim 1, wherein the component device has, a carrier for mechanical stabilization and/or for electrical contacting of the component, and/or a converter for converting electromagnetic radiation, and/or an optical element for deflecting or focusing electromagnetic radiation.

10. A component device having a plurality of components according to claim 1 arranged side by side, wherein the components each have different adjustable operating modes, and wherein the different operating modes of the individual component are adjustable by electrically activating different segments of the contact structure of the associated component.

11. A component comprising a main body and a contact structure, wherein the main body comprises an active zone which, at least in regions, is configured for generating electromagnetic radiation during operation of the component, the contact structure comprises a plurality of individually controllable segments, the component comprises a connection surface and a side surface, wherein the side surface extends transversely to the connection surface and is formed as a radiation passage surface of the component, the connection surface is formed in a structured manner, wherein the connection surface is defined by internal common interfaces between the main body and the contact structure, and wherein the segments each comprise a local common interface with the main body and are configured for injecting current into the main body in a pixelated manner, the segments of the contact structure have contact surfaces, face and are immediately adjacent to the main body and are defined by the internal common interfaces, wherein one of the segments is formed as the main segment with respect to the contact surfaces, which has the largest contact surface formed as the main contact surface compared to the other segments, the smaller contact surfaces of the other segments are formed as switchable secondary contact surfaces, and the contact surface formed as main contact surface has a rectangular shape and the contact surfaces formed as connectable secondary contact surfaces are formed curved at least in places.

12. A component device comprising a plurality of components according to claim 11, wherein, the components are formed to be switchable between at least two different operating modes during operation of the component device, and the contact surfaces of different components, which are formed as switchable secondary contact surfaces, are curved differently or are activatable differently during operation of the component device.

13. A method of operating the component of claim 1 wherein the component has different adjustable operating modes and the method comprises:

operating the different operating modes of the component by electrically activating different segments of the contact structure.

14. The method according to claim 13, wherein a first group of the segments is electrically activated, as result of which charge carriers are injected in forward-biased direction into the main body for generating electromagnetic radiation, while a second or a further group of the segments is not electrically activated or is electrically activated in such a way that the sub-regions of the main body locating under the segments of the second or further group are not configured for generating electromagnetic radiation.

15. The method according to claim 13, wherein a first group of the segments is electrically activated, resulting in injecting charge carriers in forward-biased direction into the main body for generating electromagnetic radiation, and another group of the segments is electrically activated, as a result of which charge carriers are injected into the main body in places in reverse-biased direction for forming absorbing regions.

16. The method according to claim 13, wherein a first group of the segments is electrically activated, resulting in injecting charge carriers in forward-biased direction into the main body for generating electromagnetic radiation, and a further group of the segments is electrically activated, as a result of which at least a sub-region of the main body is formed as a detector segment for measuring a photocurrent.

17. The method according to claim 13, wherein a first group of the segments is electrically activated, resulting in injecting charge carriers in forward-biased direction into the main body for generating electromagnetic radiation, and another group of the segments is electrically activated, as a result of which charge carriers are injected into the main body in places in reverse-biased direction to generate absorbing regions, and a further group of the segments is electrically activated, as a result of which at least a sub-region of the main body is configured as a detector segment for measuring a photocurrent.

18. The method according to claim 13, wherein different groups of segments are electrically activated for far-field control, for wavelength stabilization, for adjustment of facet current, for adjustment of color spectrum or exit location of the generated electromagnetic radiation, or for adjustment of resonator length, optical output power, operating current, threshold current, mode response or far-field characteristics of the component.

19. A method of operating the component of claim 11, wherein the component has different adjustable operating modes and the method comprises: operating the different operating modes of the component by electrically activating different segments of the contact structure.

* * * * *